United States Patent
Lengade et al.

(10) Patent No.: US 12,004,346 B2
(45) Date of Patent: Jun. 4, 2024

(54) MICROELECTRONIC DEVICES WITH NITROGEN-RICH INSULATIVE STRUCTURES

(71) Applicant: Micron Technology, Inc., Boise, ID (US)

(72) Inventors: Swapnil Lengade, Boise, ID (US); Jeremy Adams, Boise, ID (US); Naiming Liu, Boise, ID (US); Jeslin J. Wu, Boise, ID (US); Kadir Abdul, Singapore (SG); Carlo Mendoza Orofeo, Singapore (SG)

(73) Assignee: Micron Technology, Inc., Boise, ID (US)

( * ) Notice: Subject to any disclaimer, the term of this patent is extended or adjusted under 35 U.S.C. 154(b) by 166 days.

(21) Appl. No.: 17/200,169

(22) Filed: Mar. 12, 2021

(65) Prior Publication Data

US 2022/0293625 A1 Sep. 15, 2022

(51) Int. Cl.
*H10B 43/27* (2023.01)
*H01L 21/02* (2006.01)
*H10B 41/27* (2023.01)

(52) U.S. Cl.
CPC ......... *H10B 43/27* (2023.02); *H01L 21/0217* (2013.01); *H01L 21/02266* (2013.01); *H01L 21/02274* (2013.01); *H10B 41/27* (2023.02)

(58) Field of Classification Search
CPC .......... H01L 27/11582; H01L 21/0217; H01L 21/02266; H01L 21/02274; H01L 27/11556
See application file for complete search history.

(56) References Cited

U.S. PATENT DOCUMENTS

| | | | |
|---|---|---|---|
| 9,589,839 B1* | 3/2017 | Ikawa | H01L 27/11582 |
| 9,748,366 B2 | 8/2017 | Kim et al. | |
| 9,960,180 B1* | 5/2018 | Zhou | H01L 27/11582 |
| 9,997,373 B2 | 6/2018 | Hudson | |
| 2017/0365487 A1 | 12/2017 | Shen et al. | |
| 2019/0206697 A1 | 7/2019 | Eason et al. | |

OTHER PUBLICATIONS

Wang et al., "Understaning of Via-Etch-Induced Polymer Formation and Its Removal", J. Electrochem. Soc., vol. 144, No. 4, Apr. 1997, pp. 1522-1528.
Miyake et al., Charaterization of polymer layer formation during SiO2/SiN etching by fluoro/hydrofluorcarbon plasmas, Japanese Journal of Applied Physics, vol. 53 (2014), 7 pages.

* cited by examiner

*Primary Examiner* — Monica D Harrison
*Assistant Examiner* — Andre C Stevenson
(74) *Attorney, Agent, or Firm* — TraskBritt

(57) ABSTRACT

A method of forming a microelectronic device comprises forming a stack structure comprising a vertically alternating sequence of insulative structures and additional insulative structures, at least some of the additional insulative structures comprising silicon nitride having a ratio of nitrogen atoms to silicon atoms greater than about 1.58:1.00, forming openings through the stack structure, and forming cell pillar structures within the openings, the cell pillar structures individually comprising a semiconductor channel material vertically extending through the stack structure. Related methods, microelectronic devices, memory devices, and electronic systems are also described.

4 Claims, 11 Drawing Sheets

MICROELECTRONIC DEVICES WITH NITROGEN-RICH INSULATIVE STRUCTURES

TECHNICAL FIELD

The disclosure, in various embodiments, relates generally to the field of microelectronic device design and fabrication. More specifically, the disclosure relates to methods of forming microelectronic devices with nitrogen-rich silicon nitride, and to related apparatuses, memory devices, and electronic systems.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in a stack of tiers of conductive structures (e.g., word lines) and dielectric materials at each junction of the vertical memory strings and the conductive structures. Such a configuration permits a greater number of switching devices (e.g., transistors) to be located in a unit of die area (i.e., length and width of active surface consumed) by building the array upwards (e.g., longitudinally, vertically) on a die, as compared to structures with conventional planar (e.g., two-dimensional) arrangements of transistors.

Conventional vertical memory arrays include electrical connections between the conductive structures and access lines (e.g., the word lines) so that memory cells in the vertical memory array can be uniquely selected for writing, reading, or erasing operations. One method of forming such an electrical connection includes forming so-called at least one "staircase" (or "stair step") structure at edges (e.g., horizontal ends) of the tiers of conductive structures. The staircase structure includes individual "steps" providing contact regions of the conductive structures upon which conductive contact structures can be positioned to provide electrical access to the conductive structures.

As vertical memory array technology has advanced, additional memory density has been provided by forming vertical memory arrays to include stacks comprising additional tiers of conductive structures and, hence, additional staircase structures and/or additional steps in individual staircase structures associated therewith. As the number of steps has increased, the vertical depth (and corresponding aspect ratio) of openings in which the vertical memory strings are formed has increased. The increase in the aspect ratio of the openings increases a difficultly of forming uniformly sized and shaped openings in which the vertical memory strings are formed.

DETAILED DESCRIPTION

Figure 1A:
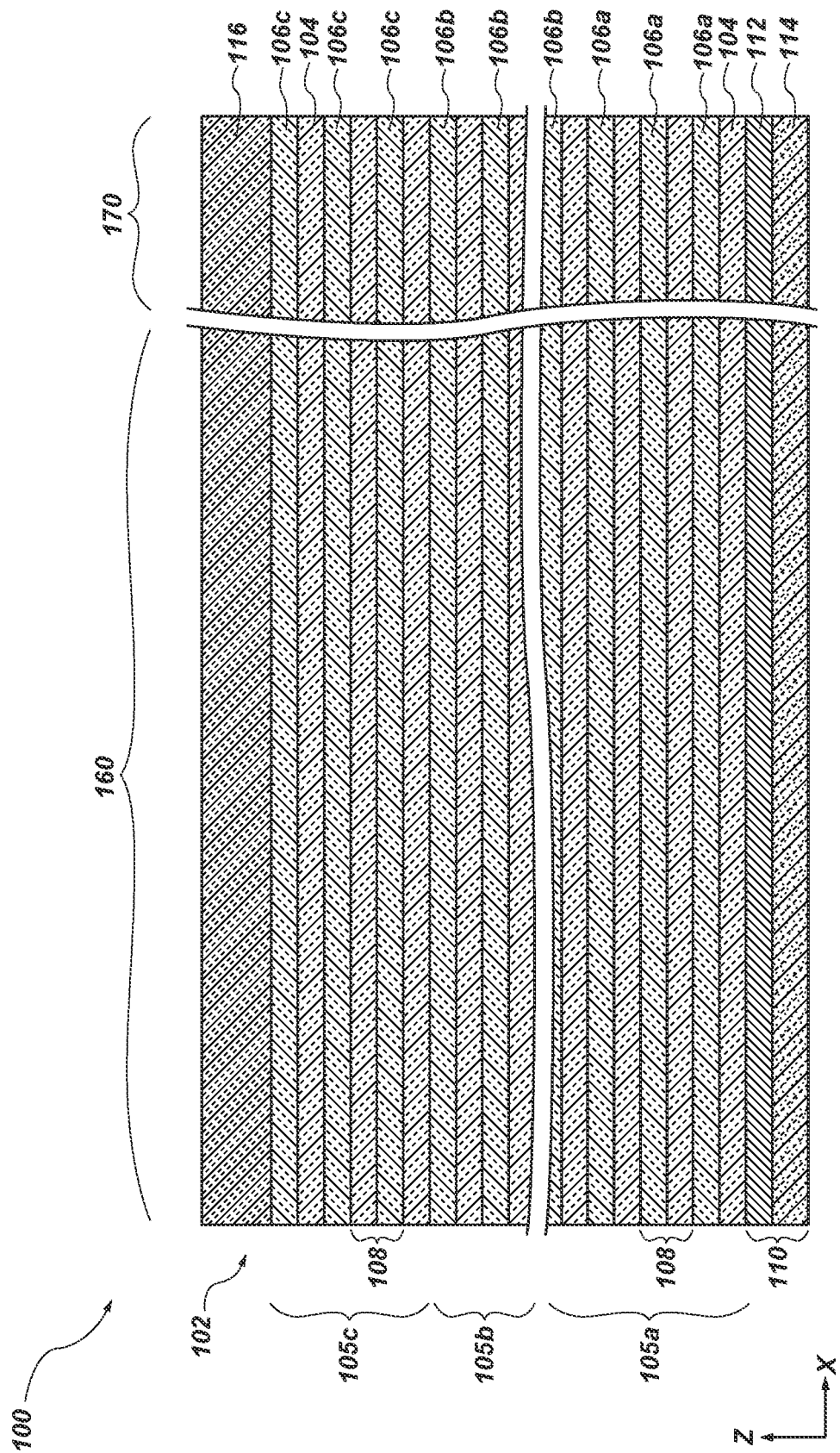
FIG. 1A through FIG. 1H are simplified cross-sectional views (FIG. 1A, FIG. 1B, and FIG. 1D through FIG. 1G) and simplified top-down views (FIG. 1C and FIG. 1H) illustrating a method of forming microelectronic device, in accordance with embodiments of the disclosure.

The illustrations included herewith are not meant to be actual views of any particular systems, microelectronic structures, microelectronic devices, or integrated circuits thereof, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing a microelectronic device (e.g., a semiconductor device, a memory device, such as DRAM memory device), apparatus, memory device, or electronic system, or a complete microelectronic device, apparatus, memory device, or electronic system including some conductive structures (e.g., select gate structures) exhibiting a greater conductivity than other conductive structures. The structures described below do not form a complete microelectronic device, apparatus, memory device, or electronic system. Only those process acts and structures necessary to understand the embodiments described herein are described in detail below. Additional acts to form a complete microelectronic device, apparatus, memory device, or electronic system from the structures may be performed by conventional techniques.

Unless otherwise specified, materials described herein may be formed by conventional techniques including, but not limited to, spin coating, blanket coating, chemical vapor deposition (CVD), atomic layer deposition (ALD), plasma enhanced ALD, physical vapor deposition (PVD), plasma enhanced chemical vapor deposition (PECVD), or low pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "memory device" means and includes microelectronic devices exhibiting memory functionality, but not necessarily limited to memory functionality. Stated another way, and by way of example only, the term "memory device" means and includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including a conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including an insulative material.

According to embodiments described herein, a microelectronic device is formed by forming openings through a stack structure comprising a vertically alternating sequence of insulative structures and additional insulative structures. The additional insulative structures may comprise nitrogen-rich silicon nitride. In some embodiments, the additional insulative structures comprise silicon nitride comprising a ratio of nitrogen atoms to silicon atoms greater than about 1.58:1.00. In some embodiments, the ratio of nitrogen atoms to silicon atoms of the additional insulative structures varies with vertical locations of the additional insulative structures. The openings may be formed by sequentially exposing the stack structure to one or more etchants formulated and configured to remove the insulative structures and the additional insulative structures and to one or more etchants formulated and configured to form a protective material (e.g., a polymer material) on vertical sidewalls defining the openings. The composition of the additional insulative structures may facilitate substantially symmetrical (e.g., circular) openings and substantially vertical sidewalls. After forming the openings, memory cell materials may be formed on sidewalls defining the openings. Slots may be formed through the stack structure to expose portions of the insulative structures and the additional insulative structures. Portions of the additional insulative structures may be selectively removed through the slots and may be replaced with a conductive material to form conductive structures in an array region. Formation of the conductive structures may form strings of memory cells, each memory cell located at an intersection of a conductive structure and the memory cell materials. The microelectronic device may include block structures including the strings of memory cells within horizontal areas thereof. In some embodiments, additional portions of the additional insulative structures are maintained (e.g., are not removed) in additional regions of the microelectronic device outside the horizontal areas of the block structures, such as in a peripheral region.

Forming the microelectronic device with the additional insulative structures comprising the ratio of nitrogen atoms to silicon atoms greater than about 1.58:1.00 may facilitate formation of vertical strings of memory cells having a substantially circular shape and defined by substantially vertical sidewalls. Vertical memory strings including the circular shape and vertical sidewalls may include memory cells exhibiting improved operating parameters (e.g., a reduce threshold voltage $V_t$) compared to conventional microelectronic devices formed without the additional insulative structures.

FIG. 1A through FIG. 1H illustrate a method of forming a microelectronic device structure, in accordance with embodiments of the disclosure. FIG. 1A is a simplified cross-sectional view of a microelectronic device structure 100 taken through section line A-A of FIG. 1B. The microelectronic device structure 100 may, for example, be formed into a portion of a memory device (e.g., a multi-deck 3D NAND Flash memory device, such as a dual deck 3D NAND Flash memory device), as described in further detail below.

Figure 1B:
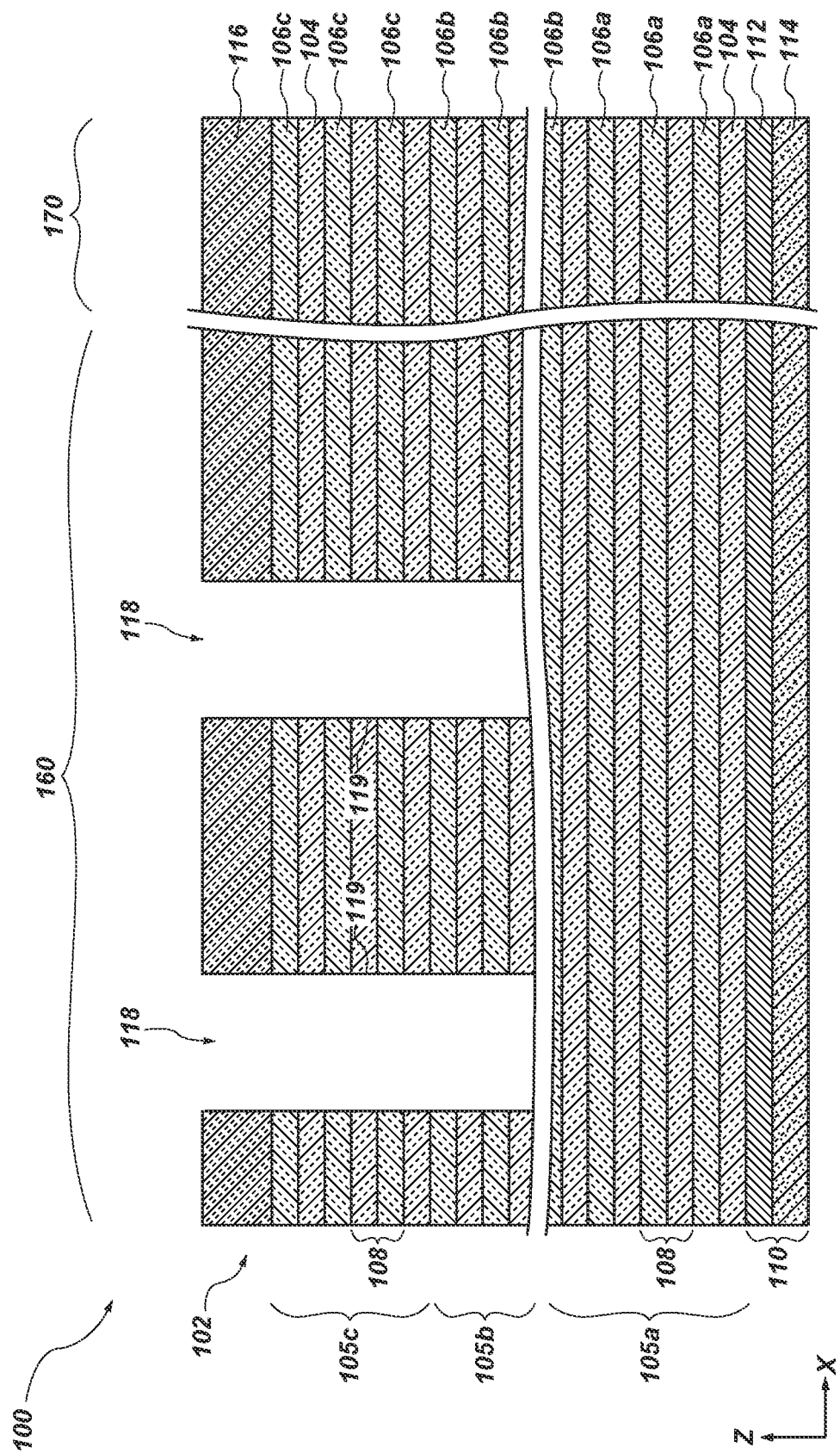

With reference to FIG. 1A and FIG. 1B, the microelectronic device structure 100 includes a stack structure 102 including a vertically alternating (e.g., in the Z-direction) sequence of insulative structures 104 and additional insulative structures 106a, 106b, 106c arranged in tiers 108. The additional insulative structures 106a, 106b, 106c may collectively be referred to herein as additional insulative structures 106. Each of the tiers 108 of the stack structure 102 may include at least one (1) of the insulative structures 104 vertically neighboring at least one (1) of the additional insulative structures 106. As will be described herein, different regions of the stack structure 102 may include different ones of the additional insulative structures 106a, 106b, 106c.

The microelectronic device structure 100 may include an array region 160 and a peripheral region 170. As will be described herein, the array region 160 may include strings (e.g., strings 146 (FIG. 1G)) of memory cells (e.g., memory cells 148 (FIG. 1G)). The peripheral region 170 may be located external to the array region 160 and may not include the strings of memory cells.

The insulative structures 104 may each individually be formed of and include, for example, an insulative material, such as one or more of an oxide material (e.g., silicon dioxide ($SiO_2$), phosphosilicate glass, borosilicate glass, borophosphosilicate glass, fluorosilicate glass, titanium dioxide ($TiO_2$), hafnium oxide ($HfO_2$), zirconium dioxide ($ZrO_2$), hafnium dioxide ($HfO_2$), tantalum oxide ($TaO_2$), magnesium oxide (MgO), aluminum oxide ($Al_2O_3$), or a combination thereof), and amorphous carbon. In some embodiments, the insulative structures 104 comprise silicon dioxide. Each of the insulative structures 104 may individually include a substantially homogeneous distribution of the at least one insulating material, or a substantially heterogeneous distribution of the at least one insulating material. As used herein, the term "homogeneous distribution" means amounts of a material do not vary throughout different portions (e.g., different horizontal portions, different vertical portions) of a structure. Conversely, as used herein, the term "heterogeneous distribution" means amounts of a material vary throughout different portions of a structure. Amounts of the material may vary stepwise (e.g., change abruptly), or may vary continuously (e.g., change progressively, such as linearly, parabolically) throughout different portions of the structure. In some embodiments, each of the insulative structures 104 of each of the tiers 108 of the stack structure 102 exhibits a substantially homogeneous distribution of insulative material. In additional embodiments, at least one of the insulative structures 104 of at least one of the tiers 108 of the stack structure 102 exhibits a substantially heterogeneous distribution of at least one insulative material. The insulative structures 104 may, for example, be formed of and include a stack (e.g., laminate) of at least two different insulative materials. The insulative structures 104 of each of the tiers 108 of the stack structure 102 may each be substantially planar, and may each individually exhibit a desired thickness.

The levels of the additional insulative structures 106 may be formed of and include an insulative material that is different than, and exhibits an etch selectivity with respect to, the insulative structures 104. In some embodiments, the additional insulative structures 106 are formed of and include a nitride material (e.g., silicon nitride ($Si_3N_4$)) or an oxynitride material (e.g., silicon oxynitride). In some embodiments, the additional insulative structures 106 comprise silicon nitride. As will be described herein, at least some of the additional insulative structures 106 may comprise non-stoichiometric silicon nitride. In some embodiments, the additional insulative structures 106 comprise nitrogen-rich silicon nitride.

The additional insulative structures 106 may comprise a nitrogen to silicon ratio (N:Si) greater than about 1.58:1.00, such as greater than about 1.60:1.00 greater than about 1.62:1.00, greater than about 1.64:1.00, greater than about 1.66:1.00, greater than about 1.68:1.00, or greater than about 1.70:1.00. In other words, the additional insulative structures 106 may comprise greater than about 1.58 atoms of nitrogen for every atom of silicon. The ratio of nitrogen atoms to silicon atoms of the additional insulative structures 106 may be within a range from about 1.58:1.00 to about 1.60:1.00, from about 1.60:1.00 to about 1.62:1.00, from about 1.62:1.00 to about 1.64:1.00, from about 1.64:1.00 to about 1.66:1.00, from about 1.66:1.00 to about 1.68:1.00, or from about 1.68:1.00 to about 1.70:1.00. In some embodiments, the ratio of nitrogen atoms to silicon atoms of the additional insulative structures 106 is within a range from about 1.60:1.00 to about 1.65:1.00.

The stack structure 102 may include a first region 105a including first additional insulative structures 106a; a second region 105b including second additional insulative structures 106b; and a third region 105c including third additional insulative structures 106c. In some embodiments, the first additional insulative structures 106a, the second additional insulative structures 106b, and the third additional insulative structures 106c comprise substantially the same material composition and do not substantially differ from each other. In some such embodiments, the material composition of the additional insulative structures 106 may not differ throughout the stack structure 102. In other embodiments, each of the first additional insulative structures 106a, the second additional insulative structures 106b, and the third additional insulative structures 106c comprises silicon nitride, but the ratio of nitrogen atoms to silicon atoms in each of the first additional insulative structures 106a, the second additional insulative structures 106b, and the third additional insulative structures 106c differs.

In some embodiments, each of the first additional insulative structures 106a of the first region 105a comprises substantially the same material composition; each of the second additional insulative structures 106b of the second region 105b comprises substantially the same material composition; and each of the third additional insulative structures 106c of the third region 105c comprises substantially the same material composition. In some embodiments, the first additional insulative structures 106a comprise substantially the same material composition as the third additional insulative structures 106c and a different material composition than the second additional insulative structures 106b. In other words, the second additional insulative structures 106b may comprise a different material composition than each of the first additional insulative structures 106a and the third additional insulative structures 106c.

In some embodiments, the ratio of nitrogen atoms to silicon atoms of the first additional insulative structures 106a and the third additional insulative structures 106c may be greater than the ratio of nitrogen atoms to silicon atoms of the second additional insulative structures 106b. By way of non-limiting example, in some embodiments, the first additional insulative structures 106a and the second additional insulative structures 106b comprise a ratio of nitrogen atoms to silicon atoms greater than about 1.60:1.0 while the second additional insulative structures 106b comprise a ratio of nitrogen atoms to silicon atoms less than about 1.60:1.0.

In some embodiments, at least one of the first additional insulative structures 106a of the first region 105a may exhibit a different material composition than at least another of the first additional insulative structures 106a of the first region 105a. In some embodiments, the first region 105a exhibits a gradient of the ratio of nitrogen atoms to silicon atoms of the first additional insulative structures 106a. By way of non-limiting example, in some embodiments, a vertically (e.g., in the Z-direction) lowermost one of the first additional insulative structures 106a may comprise a higher ratio of nitrogen atoms to silicon atoms than vertically overlying first additional insulative structures 106a and a vertically uppermost first additional insulative structure 106a of the first region 105a may exhibit a lower ratio of nitrogen atoms to silicon atoms that vertically underlying first additional insulative structures 106a.

At least one of the second additional insulative structures 106b of the second region 105b may exhibit a different material composition than at least another of the second additional insulative structures 106b of the second region 105b. In some embodiments, the second region 105b exhibits a gradient of the ratio of nitrogen atoms to silicon atoms of the second additional insulative structures 106b. By way of non-limiting example, in some embodiments, a vertically (e.g., in the Z-direction) lowermost one of the second additional insulative structures 106b and a vertically uppermost one of the second additional insulative structures 106b may each comprise a higher ratio of nitrogen atoms to silicon atoms than a vertically central one of the second additional insulative structures 106b. In other words, the ratio of nitrogen atoms to silicon atoms of the second additional insulative structures 106b of the second region 105b may increase with an increasing vertical distance from the vertical center of the second region 105b. Stated another way, the second additional insulative structures 106b most proximate the first region 105a and the second additional insulative structures 106b most proximate the third region 105c may comprise a greater ratio of nitrogen atoms to silicon atoms relative to the second additional insulative structures 106b more distal from the first region 105a or the third region 105c.

In some embodiments, at least one of the third additional insulative structures 106c of the third region 105c may exhibit a different material composition than at least another of the third additional insulative structures 106c of the third region 105c. In some embodiments, the third region 105c exhibits a gradient of the ratio of nitrogen atoms to silicon atoms of the third additional insulative structures 106c. By way of non-limiting example, in some embodiments, a vertically (e.g., in the Z-direction) lowermost one of the third additional insulative structures 106c may comprise a lower ratio of nitrogen atoms to silicon atoms than vertically overlying third additional insulative structures 106c and a vertically uppermost third additional insulative structure 106c of the third region 105c may exhibit a higher ratio of nitrogen atoms to silicon atoms that vertically underlying third additional insulative structures 106c.

In some embodiments, the stack structure 102 comprises additional insulative structures 106 comprising an increasing ratio of nitrogen atoms to silicon atoms with an increasing vertical (e.g., in the Z-direction) distance from a vertical center of the stack structure 102. In some such embodiments, a vertically uppermost and a vertically lowermost additional insulative structure 106 comprises a higher ratio of nitrogen atoms to silicon atoms than vertically central additional insulative structures 106.

A refractive index (RI) of the additional insulative structures 106 may be less than a refractive index of stoichiometric silicon nitride. In some embodiments, the refractive index of each of the additional insulative structures 106 is less than about 2.000, such as less than about 1.950, less than about 1.900, less than about 1.880, less than about 1.860, less than about 1.840, or less than about 1.820. In some embodiments, the refractive index of each of the additional insulative structures 106 is about the same as the refractive index of the other additional insulative structures 106.

In some embodiments, the refractive index of the first additional insulative structures 106a and the third additional insulative structures 106c is less than the refractive index of the second additional insulative structures 106b. In some embodiments, the refractive index of the additional insulative structures 106 decreases with an increasing vertical (e.g., in the Z-direction) distance from the center of the stack structure 102.

A density of the additional insulative structures 106 may be less than a density of stoichiometric silicon nitride. In some embodiments, the density each of the additional insulative structures 106 is less than about 2.80 g/cm$^3$, less than about 2.70 g/cm$^3$, less than about 2.60 g/cm$^3$, or less than about 2.50 g/cm$^3$. The density of the additional insulative structures 106 may be within a range from about 2.40 g/cm$^3$ and about 2.60 g/cm$^3$, such as within a range from about 2.45 g/cm$^3$ to about 2.55 g/cm$^3$. In some embodiments, the density of the additional insulative structures 106 is about 2.50 g/cm$^3$.

In some embodiments, the density of the first additional insulative structures 106a and the third additional insulative structures 106c is less than the density of the second additional insulative structures 106b. In some embodiments, the density of the additional insulative structures 106 decreases with an increasing vertical (e.g., in the Z-direction) distance from the center of the stack structure 102.

Each of the insulative structures 104 may be formed by one or more of CVD, ALD, plasma enhanced ALD, PECVD, or LPCVD. In some embodiments, the insulative structures 104 are formed by PECVD. The insulative structures 104 may be formed with precursors including an oxygen source and a silicon source. In some embodiments, the oxygen source comprises oxygen ($O_2$) and the silicon source comprises tetraethyl orthosilicate (TEOS) ($Si(OC_2H_5)_4$).

Each of the additional insulative structures 106 may be formed by one or more of CVD, ALD, plasma enhanced ALD (PEALD), PECVD, or LPCVD. In some embodiments, the additional insulative structures 106 are formed by PECVD. By way of non-limiting example, the additional insulative structures 106 are formed by PECVD at a temperature within a range from about 400° C. to about 700° C., such as within a range from about 400° C. to about 500° C., from about 500° C. to about 600° C., or from about 600° C. to about 700° C. In some embodiments, the additional insulative structures 106 are formed at a temperature of about 540° C.

The additional insulative structures 106 may be formed with precursors comprising a nitrogen source and a silicon source. By way of non-limiting example, the nitrogen source may comprise ammonia ($NH_3$) and the silicon source may comprise silane ($SH_4$). A ratio of nitrogen atoms to silicon atoms of the additional insulative structures 106 may be controlled by controlling the ratio of the nitrogen source to the silicon source during formation (e.g., deposition) of the additional insulative structures 106. For example, increasing the ratio of the flowrate of the nitrogen source relative to the flowrate of the silicon source during deposition of the additional insulative structures 106 may increase the ratio of nitrogen atoms to silicon atoms of the resulting additional insulative structure 106.

In some embodiments, a flowrate of the nitrogen source may be greater than a flowrate of the silicon source during formation of the additional insulative structures 106. By way of non-limiting example, the flowrate of ammonia may be within a range from about 15,000 standard cubic centimeters per minute (sccm) to about 22,000 sccm, such as from about 15,000 sccm to about 16,000 sccm, from about 16,000 sccm to about 18,000 sccm, from about 18,000 sccm to about 20,000 sccm, or from about 20,000 sccm to about 22,000 sccm.

The flowrate of silicon source may be within a range from about 300 sccm to about 700 sccm, such as from about 300 sccm to about 400 sccm, from about 400 sccm to about 500 sccm, from about 500 sccm to about 600 sccm, or from about 600 sccm to about 700 sccm.

In some embodiments, a ratio of the flowrate of the nitrogen source to the flowrate of the silicon source may be within a range from about 20:1 to about 70:1, such as from about 20:1 to about 40:1, from about 40:1 to about 50:1, from about 50:1 to about 60:1, from about 60:1 to about 70:1, or from about 70:1 to about 75:1.

A pressure of the deposition chamber during formation of the additional insulative structures 106 may be within a range from about 5 torr to about 10 torr, such as from about 5 torr to about 6 torr, from about 6 torr to about 7 torr, from about 7 torr to about 8 torr, from about 8 torr to about 9 torr, or from about 9 torr to about 10 torr. In some embodiments, the pressure is greater than about 7 torr.

Although FIG. 1A illustrates that the first region 105a includes a particular number of tiers 108 of the insulative structures 104 and the first additional insulative structures 106a, the disclosure is not so limited. In some embodiments, the first region 105a includes a desired quantity of tiers 108, such as within a range from two (2) of the tiers 108 to thirty-two (32) of the tiers 108. In some embodiments, the first region 105a includes fifteen (15) of the tiers 108. In other embodiments, the first region 105a includes a different number of the tiers 108, such as less than fifteen (15) of the tiers 108 (e.g., less than or equal to twelve (12) of the tiers 108, less than or equal to ten (10) of the tiers 108, less than or equal to eight (8) of the tiers 108, less than or equal to six (6) of the tiers 108, less than or equal to four (4) of the tiers 108); or greater than fifteen (15) of the tiers 108 (e.g., greater than or equal to eighteen (18) of the tiers 108, greater than or equal to twenty (20) of the tiers 108, greater than or equal to twenty-five (25) of the tiers 108, greater than or equal to thirty (30) of the tiers 108, greater than or equal to thirty-two (32) of the tiers 108) of the insulative structures and the first additional insulative structures 106a.

Although FIG. 1A illustrates that the second region 105b includes a particular number of the tiers 108 of the insulative structures 104 and the second additional insulative structures 106b, the disclosure is not so limited. In some embodiments, the second region 105b includes a desired quantity of tiers 108, such as within a range from fifty (50) of the tiers 108 to two hundred fifty-six (256) of the tiers 108. In some embodiments, the second region 105b includes a desired quantity of the tiers 108, such as within a range from seventy (70) of the tiers 108 to one hundred (100) of the tiers 108. In other embodiments, the second region 105b includes a different number of the tiers 108, such as less than seventy (70) of the tiers 108 (e.g., less than or equal to sixty (60) of the tiers 108, less than or equal to fifty (50) of the tiers 108, less than or equal to forty (40) of the tiers 108, less than or equal to thirty (30) of the tiers 108, less than or equal to twenty (20) of the tiers 108); or greater than one hundred (100) of the tiers 108 (e.g., greater than or equal to one hundred twenty-eight (128) of the tiers 108, greater than or equal to one hundred fifty (150) of the tiers 108, greater than or equal to two hundred (200) of the tiers 108, greater than or equal to two hundred fifty-six (256) of the tiers 108 of the insulative structures and the second additional insulative structures 106b.

Although FIG. 1A illustrates that the third region 105c includes a particular number of tiers 108 of the insulative structures 104 and the third additional insulative structures 106c, the disclosure is not so limited. In some embodiments, the third region 105c includes a desired quantity of tiers 108, such as within a range from two (2) of the tiers 108 to thirty-two (32) of the tiers 108. In some embodiments, the third region 105c includes fifteen (15) of the tiers 108. In other embodiments, the third region 105c includes a different number of the tiers 108, such as less than fifteen (15) of the tiers 108 (e.g., less than or equal to twelve (12) of the tiers 108, less than or equal to ten (10) of the tiers 108, less than or equal to eight (8) of the tiers 108, less than or equal to six (6) of the tiers 108, less than or equal to four (4) of the tiers 108); or greater than fifteen (15) of the tiers 108 (e.g., greater than or equal to eighteen (18) of the tiers 108, greater than or equal to twenty (20) of the tiers 108, greater than or equal to twenty-five (25) of the tiers 108, greater than or equal to thirty (30) of the tiers 108, greater than or equal to thirty-two (32) of the tiers 108) of the insulative structures and the third additional insulative structures 106c.

Although FIG. 1A illustrates a particular number of tiers 108 of the insulative structures 104 and the additional insulative structures 106, the disclosure is not so limited. In some embodiments, the stack structure 102 includes a desired quantity of the tiers 108, such as within a range from thirty-two (32) of the tiers 108 to two hundred fifty-six (256) of the tiers 108. In some embodiments, the stack structure 102 includes sixty-four (64) of the tiers 108. In other embodiments, the stack structure 102 includes a different number of the tiers 108, such as less than sixty-four (64) of the tiers 108 (e.g., less than or equal to sixty (60) of the tiers 108, less than or equal to fifty (50) of the tiers 108, less than about forty (40) of the tiers 108, less than or equal to thirty (30) of the tiers 108, less than or equal to twenty (20) of the tiers 108, less than or equal to ten (10) of the tiers 108); or greater than sixty-four (64) of the tiers 108 (e.g., greater than or equal to seventy (70) of the tiers 108, greater than or equal to one hundred (100) of the tiers 108, greater than or equal to about one hundred twenty-eight (128) of the tiers 108, greater than two hundred fifty-six (256) of the tiers 108) of the insulative structures 104 and the additional insulative structures 106. In addition, in some embodiments, the stack structure 102 overlies a deck structure comprising additional tiers 108 of insulative structures 104 and the additional insulative structures, separated from the stack structure 102 by at least one dielectric material, such as an interdeck insulative material.

With continued reference to FIG. 1A, the microelectronic device structure 100 further includes a source tier 110 vertically underlying (e.g., in the Z-direction) the stack structure 102. The source tier 110 may comprise, for example, a first source material 112 and a second source material 114. The first source material 112 may be formed of and include at least one conductive material, such as one or more of a metal (e.g., W, Ti, Mo, Nb, V, Hf, Ta, Cr, Zr, Fe, Ru, Os, Co, Rh, Ir, Ni, Pa, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy), a conductive metal-containing material (e.g., a conductive metal nitride, a conductive metal silicide, a conductive metal carbide, a conductive metal oxide), or a doped semiconductor material (e.g., a semiconductor material doped with one or more P-type dopants (e.g., polysilicon doped with at least one P-type dopant, such as one or more of boron, aluminum, and gallium) or one or more N-type conductivity materials (e.g., polysilicon doped with at least one N-type dopant, such as one or more of arsenic, phosphorous, antimony, and bismuth)). In some embodiments, the first source material 112 comprises conductively-doped silicon.

The second source material 114 may be formed of and include one or more of a metal silicide material (e.g., tungsten silicide ($WSi_x$)), a metal nitride material (e.g., tungsten nitride), and a metal silicon nitride material (e.g., tungsten silicon nitride ($WSi_xN_y$)). In some embodiments, the second source material 114 comprises tungsten silicide.

A dielectric material 116 may vertically (e.g., in the Z-direction) overlie a vertically uppermost tier 108 of the insulative structures 104 and the additional insulative structures 106. The dielectric material 116 may comprise one or more of the materials described above with reference to the insulative structures 104. In some embodiments, the dielectric material 116 comprises silicon dioxide.

Figure 1C:
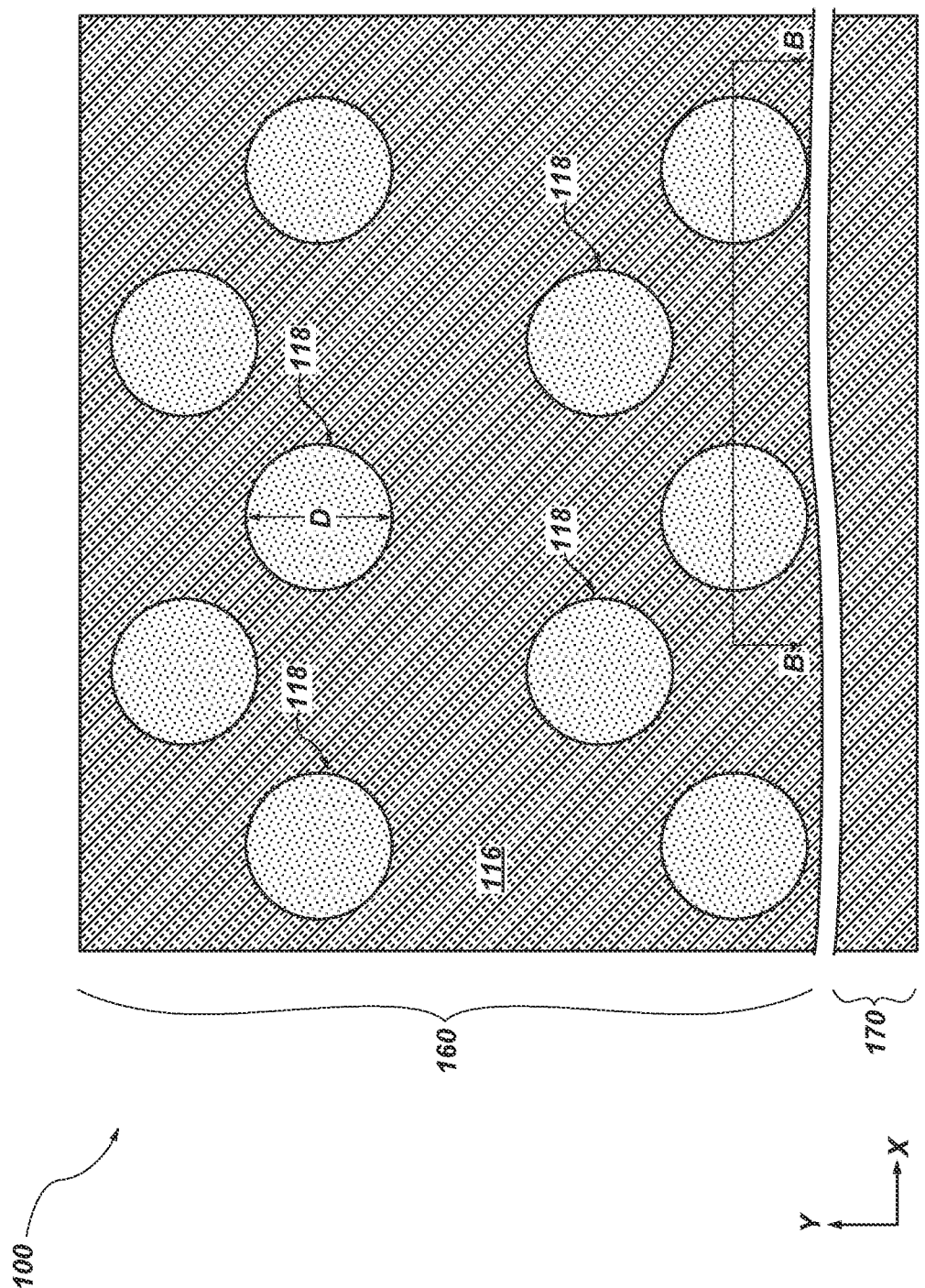

With reference to FIG. 1B and FIG. 1C, partial openings 118 (e.g., less than complete openings, initial openings, preliminary openings) may be formed through the dielectric material 116 and through at least a portion of the stack structure 102. FIG. 1C is a simplified top view of the microelectronic device structure 100 after forming the partial openings 118 and FIG. 1B is a simplified partial cross-sectional view of the microelectronic device structure 100 taken through section line B-B of FIG. 1C.

In some embodiments, openings may be formed in a mask material (e.g., a hard mask material, a photoresist material, polysilicon, a metal material (e.g., tungsten), or a metal nitride material (e.g., titanium nitride)) vertically overlying the dielectric material 116 and the partial openings 118 defined by substantially vertically (e.g., in the Z-direction) sidewalls 119 may be formed through corresponding openings in the mask material. As will be described herein, the partial openings 118 may be used to form pillars 124 (FIG. 1F) for forming strings 146 (FIG. 1G) of memory cells 148 (FIG. 1G).

With reference to FIG. 1C, partial openings 118 that laterally neighbor one another in the Y-direction may be offset from each other in the X-direction. Accordingly, the partial openings 118 may be arranged in a so-called weave pattern, which may facilitate an increased density of the pillars 124 (FIG. 1F) (and the resulting strings (e.g., strings 146 (FIG. 1G)) of memory cells (e.g., memory cells 148 (FIG. 1G))) to be formed in the partial openings 118. However, the disclosure is not so limited and the partial openings 118 may be arranged in other patterns (e.g., lines wherein the partial openings 118 of each line are aligned with partial openings 118 of each of the other lines). In some embodiments, each partial opening 118 may be surrounded by six (6) other partial openings 118 and may be arranged in a hexagonal pattern.

The partial openings 118 may have a horizontal dimension (e.g., diameter) D within a range from about 60 nanometers (nm) to about 120 nm, such as from about 60 nm to about 80 nm, from about 80 nm to about 100 nm, or from about 100 nm to about 120 nm. In some embodiments, the horizontal dimension D is about 100 nm. However, the disclosure is not so limited and the horizontal dimension D may be different than those described.

Although the partial openings 118 are illustrated as extending a particular vertical (e.g., in the Z-direction) depth into the stack structure 102, the disclosure is not so limited. The partial openings 118 may vertically extend into the stack structure 102 any desired number of the tiers 108. For example, the partial openings 118 may extend into the stack structure 102 fewer than sixty (60) of the tiers 108, fewer than fifty (50) of the tiers 108, fewer than forty (40) of the tiers 108, fewer than thirty (30) of the tiers 108, fewer than twenty (20) of the tiers 108, fewer than ten (10) of the tiers 108, or fewer than five (5) of the tiers 108.

The partial openings 118 may be formed by exposing the microelectronic device structure 100 to one or more etchants (e.g., dry etchants) in, for example, a reactive ion etching (RIE) tool or a plasma etching tool (e.g., an inductively coupled pulsed plasma etching tool). In some embodiments, the etching tool is configured to dissociate one or more etch gases provided to the etching tool to generate one or more dissociated species, which may include one or more radicals and one or more ionic species. In some embodiments, the insulative structures 104 are removed by exposure to ions containing fluorine and the additional insulative structures 106 are removed by exposure to ions containing hydrogen.

The partial openings 118 may be formed by exposing the microelectronic device structure 100 to one or more etchants, such as one or more fluorocarbons (e.g., one or more of $C_2H_2F_2$, $C_2F_8$, $C_2F_6$, $C_4F_6H_2$, $C_4F_6$, $C_4F_8$, $C_5F_8$, $C_6F_6$, $CHF_3$, $CF_4$), $SF_6$, $SiCl_4$, HBr, $NF_3$, $Cl_2$, $SiF_4$, or another gas.

In some embodiments, the composition of the etchants may be adjusted during formation of the partial openings 118. For example, the ratio of various components of the etchant composition may be adjusted during formation of the partial openings 118. In some embodiments, the ratio of fluorine-containing gases (e.g., fluorocarbons) to hydrogen-containing gases (e.g., hydrocarbons) is adjusted to selectively etch the insulative structures 104 or the additional insulative structures 106 relative to the other of the insulative structures 104 and the additional insulative structures 106.

By way of non-limiting example, a ratio of carbon atoms to fluorine atoms in the etchant and the ratio of the carbon atoms to the hydrogen atoms in the etchant may be adjusted to tailor an etch selectivity of the insulative structures 104 and the additional insulative structures 106. In some embodiments, a ratio of carbon atoms to fluorine atoms may be increased to increase the etch rate of the insulative structures 104 relative to the additional insulative structures 106. A ratio of carbon atoms to hydrogen atoms in the etchant may be increased to increase the etch rate of the additional insulative structures 106 relative to the insulative structures 104.

In some embodiments, the insulative structures 104 may be removed with fluorocarbon etchants. For example, the oxide of the insulative structures 104 may be bombarded with the fluorocarbon etchant to break the silicon-oxygen bond and form $SiF_4$, CO, and $CO_2$, which are evacuated from the chamber of the etching tool.

In some embodiments, the additional insulative structures 106 may be removed with etchants comprising hydrogen, such as hydrocarbon gases. In some embodiments, hydrogen from the etchant breaks the bond between silicon and nitrogen of the additional insulative structures 106. In some embodiments hydrogen atoms and carbon atoms of the etchant bond with the nitrogen of the additional insulative structures 106 to form hydrogen cyanide (HCN), which is a volatile gas that is removed from the chamber of the etching tool.

Figure 1D:
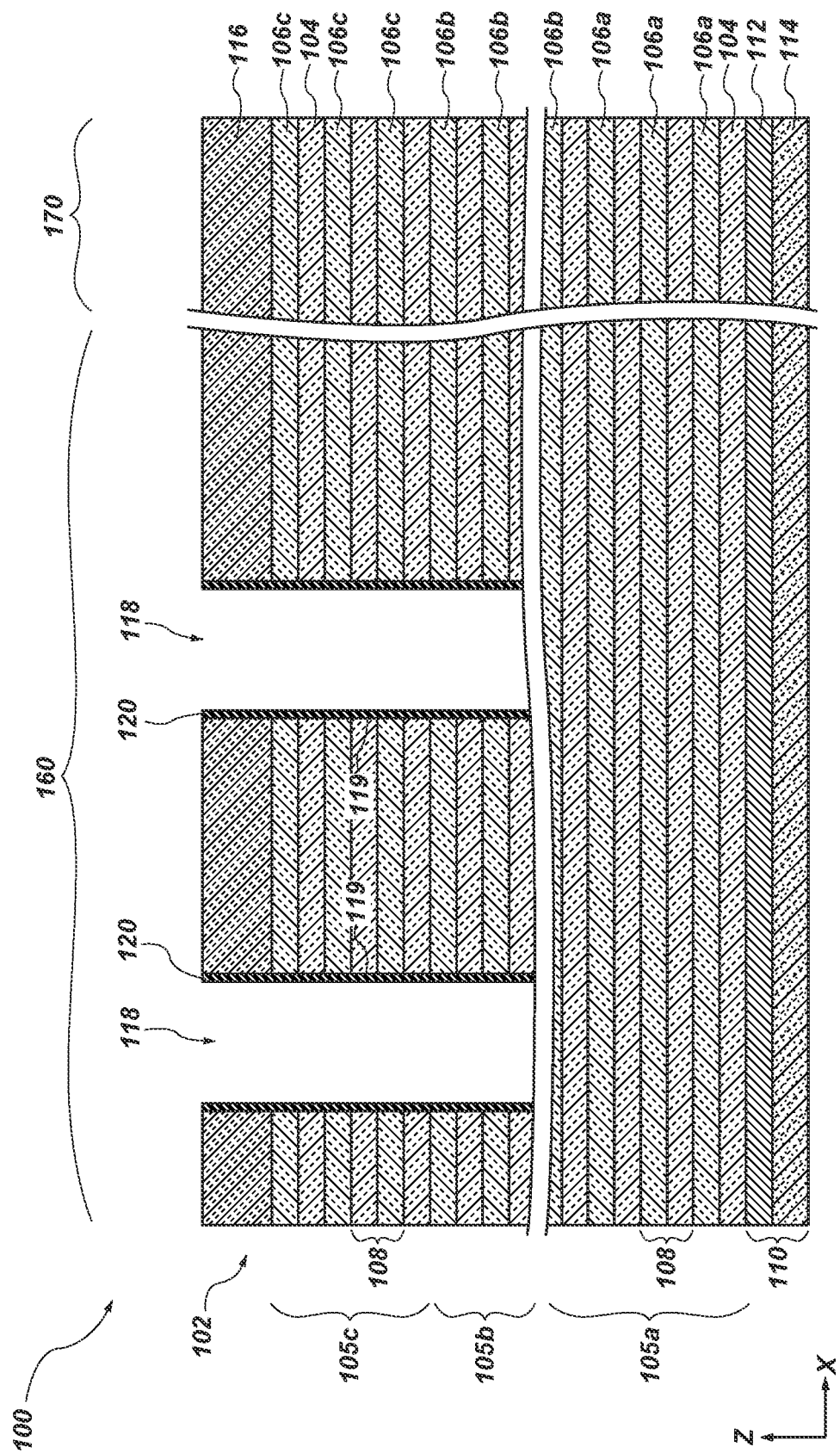

With reference to FIG. 1D, in some embodiments, a protective material 120 may be formed on the sidewalls 119 defining the partial openings 118. The protective material 120 may facilitate control of the vertical (e.g., in the Z-direction) profile of the partial openings 118 and openings 122 (FIG. 1E) to be formed from the partial openings 118. For example, the protective material 120 may protect the vertical sidewalls 119 defining the partial openings 118 from lateral (e.g., in the X-direction, in the Y-direction) etching during formation of the partial openings 118 and formation of the openings 122 (e.g., during removal of the insulative structures 104 and the additional insulative structures 106 vertically underlying the protective material 120).

The protective material 120 may comprise a polymer material. For example, the protective material 120 may include a polymer material formed from radicals such as $H_2$, $C_2F_2$, $C_2F_3$, $C_2F_4$, $CHF_3$, $CH_2F_2$, or other polymer forming materials. In some such embodiments, the protective material 120 may comprise $C_xF_y$, wherein x and y individually comprise an integer or a non-integer. In some embodiments, a ratio of carbon atoms to fluorine atoms in the etchant may be increased to facilitate formation of the protective material 120. Accordingly, in some embodiments, the composition of the etchant may be adjusted to facilitate formation of the protective material 120 on the sidewalls defining the partial openings 118 preferentially to removing the insulative structures 104 and the additional insulative structures 106. In other words, during formation of the partial openings 118, the composition of the etchant may be cycled to selectively remove the insulative structures 104, selectively remove the additional insulative structures 106, or to form the protective material on the sidewalls 119 defining the partial openings 118.

Figure 1E:
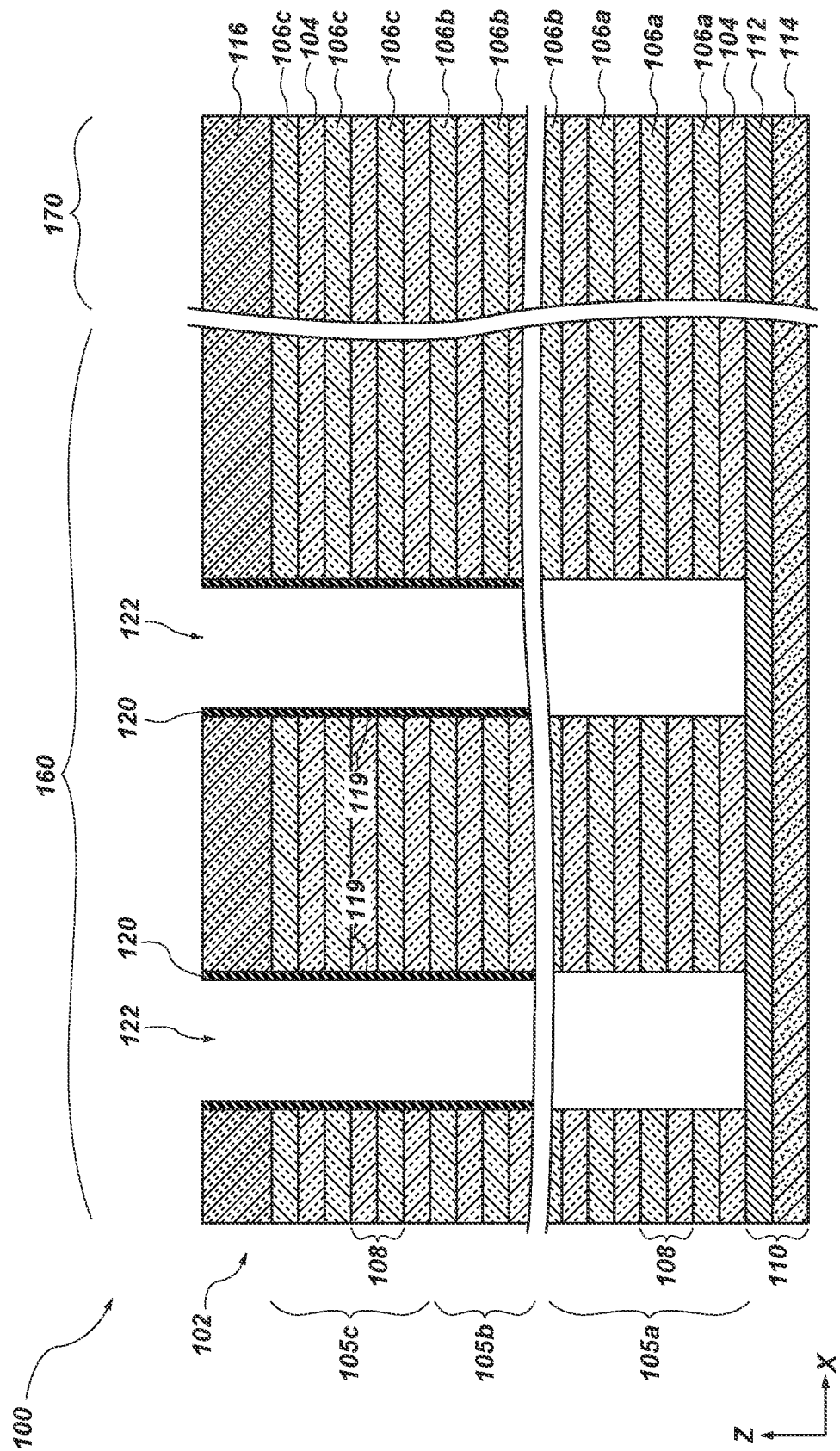

Referring now to FIG. 1E, after forming the protective material 120, the openings 122 may be formed from the partial openings 118 (FIG. 1D) by removing additional portions of the tiers 108 through the partial openings 118. The additional portions of the tiers 108 may be removed as described above with reference to formation of the partial openings 118. In some embodiments, the etchant may be tailored to form additional protective material 120 on the sidewalls 119 exposed by removal of the additional tiers 108.

Although FIG. 1B through FIG. 1E illustrate forming the protective material 120 only once in the partial opening 118, the disclosure is not so limited. In other embodiments, the partial openings 118 may be formed to a predetermined vertical (e.g., in the Z-direction) depth, the protective material 120 may be formed on the sidewalls 119 defined by the exposed portions of the insulative structures 104 and the additional insulative structures 106. After forming the protective material 120 on the sidewalls 119, the depth of the partial openings 118 may be increased by removing additional tiers 108 of the insulative structures 104 and the additional insulative structures 106. Additional protective material 120 may be formed on newly exposed portions of the insulative structures 104 and the additional insulative structures 106. The process of removing the tiers 108 of the insulative structures 104 and the additional insulative structures 106, followed by forming the protective material 120 on the sidewalls 119 may be repeated a desired number of times until the openings 122 are formed.

Figure 1F:
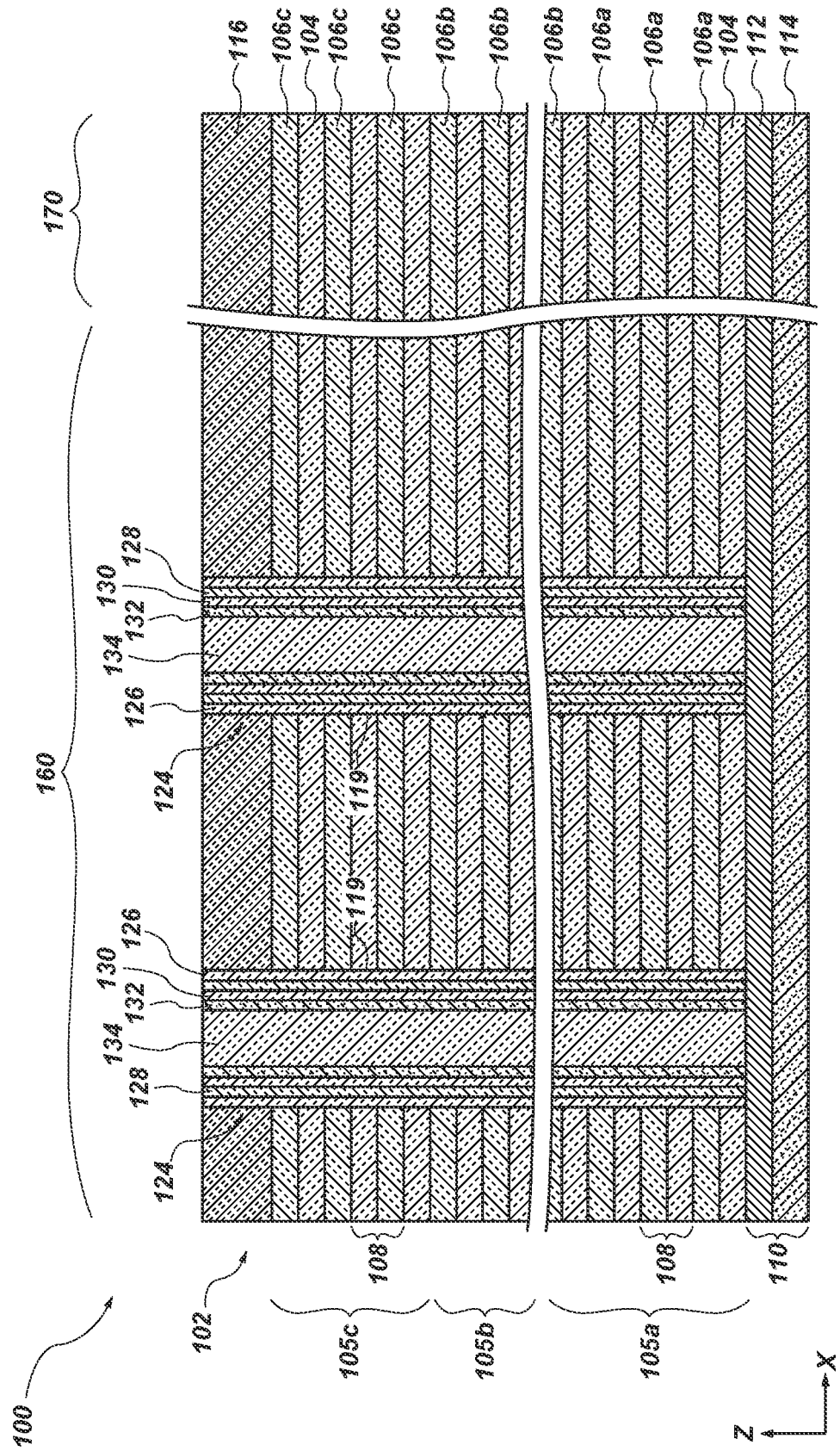
Figure 1G:
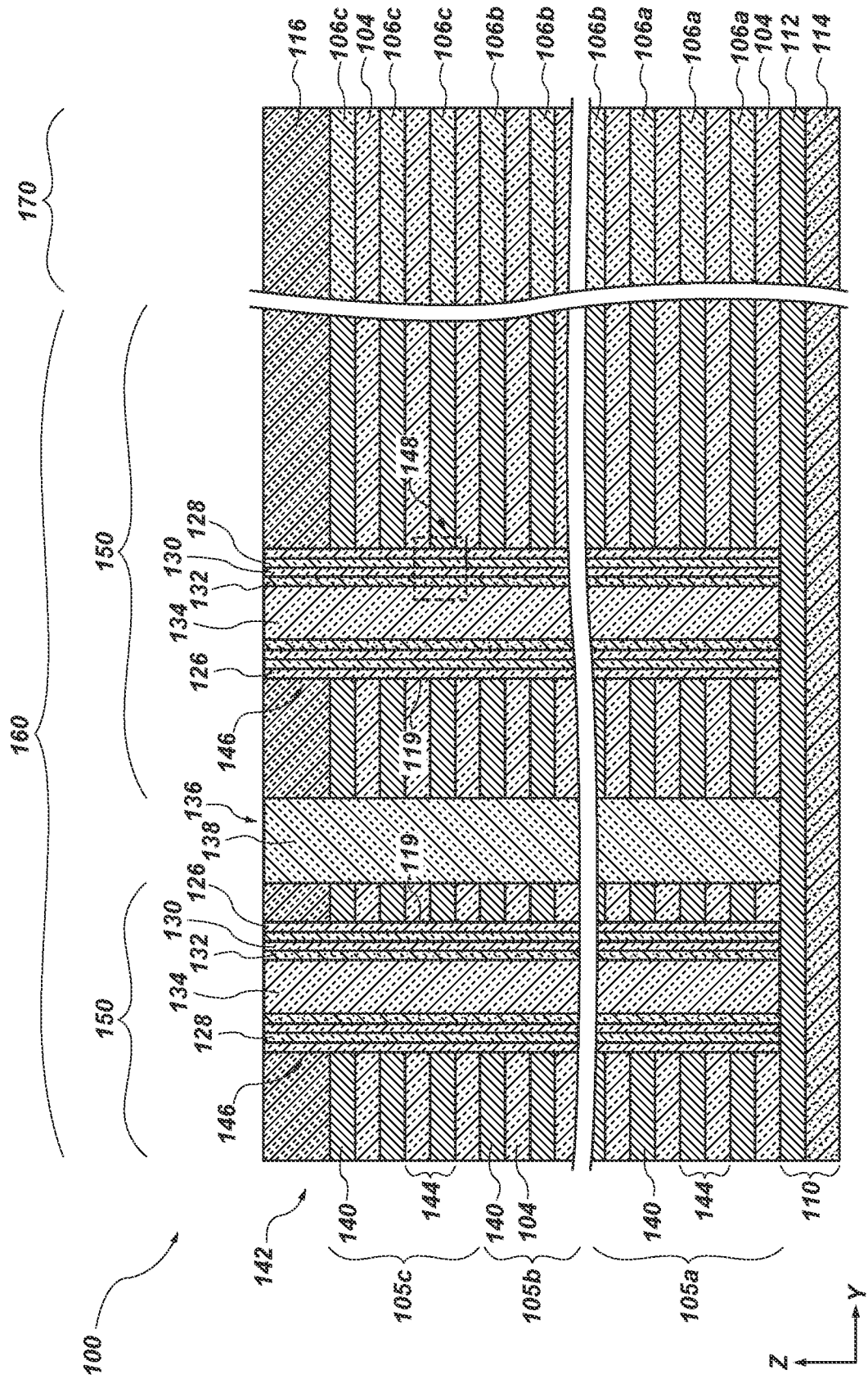

Referring now to FIG. 1F, after forming the openings 122 (FIG. 1E), the protective material 120 (FIG. 1E) may be removed from the sidewalls 119 defining the openings 122. The protective material 120 may be removed with a dry etchant or a wet etchant. In some embodiments, the protective material 120 is removed by exposing the protective material 120 to one or more of oxygen ($O_2$), hydrogen ($H_2$), an oxygen-containing gas, and a hydrogen-containing gas. In other embodiments, the protective material 120 is removed by exposing the protective material 120 to a wet etchant, such as one or more of an amine-based solvent (e.g., alkanolamines, hydroxylamine, an alkanolamine (e.g., monoethanolamine, isopropanolamine, diethanolamine (DEA), triethanolamine, N-methylethanolamine, N-methyldiethanolamine), an alkylamine (e.g., methylamine, dimethylamine, trimethylamine, tert-butylamine, ethylamine, diethylamine, isopropylamine, diisopropylamine, 1,1-dimethylhydrazine, N,N-dimethylethylamine, N,N-diethylmethylamine), and a cyclic amine (e.g., imidazole, pyridine, piperazine)).

With continued reference to FIG. 1F, after removing the protective material 120 (FIG. 1E) from the openings 122, one or more materials may be formed within the openings 122 to form pillars 124 including one or more materials for forming memory cells (e.g., memory cells 148 (FIG. 1G)) (e.g., strings of NAND memory cells). The pillars 124 may vertically extend (e.g., in the Z-direction) through the stack structure 102. The pillars 124 may each individually comprise a charge blocking material (also referred to as a "dielectric blocking material") 126 horizontally neighboring the levels of the insulative structures 104 and the additional insulative structures 106 of one of the tiers 108 of the stack structure 102; a memory material 128 horizontally neighboring the charge blocking material 126; a tunnel dielectric material (also referred to as a "tunneling dielectric material") 130 horizontally neighboring the memory material 128; a channel material 132 horizontally neighboring the tunnel dielectric material 130; and an insulative material 134 in a center portion of the pillars 124. The channel material 132 may be horizontally interposed between the insulative material 134 and the tunnel dielectric material 130; the tunnel dielectric material 130 may be horizontally interposed between the channel material 132 and the memory material 128; the memory material 128 may be horizontally interposed between the tunnel dielectric material 130 and the charge blocking material 126; the charge blocking material 126 may be horizontally interposed between the memory material 128 and the levels of the insulative structures 104 and additional insulative structures 106. In some embodiments, a barrier material is horizontally interposed between the charge blocking material 126 and the levels of the insulative structures 104 and the additional insulative structures 106.

The charge blocking material 126 may be formed of and include a dielectric material such as, for example, one or more of an oxide (e.g., silicon dioxide), a nitride (silicon nitride), and an oxynitride (silicon oxynitride), or another material. In some embodiments, the charge blocking material 126 comprises silicon oxynitride.

The memory material 128 may comprise a charge trapping material or a conductive material. The memory material 128 may be formed of and include one or more of silicon nitride, silicon oxynitride, polysilicon (doped polysilicon), a conductive material (tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), a semiconductive material polycrystalline or amorphous semiconductor material including at least one elemental semiconductor element or at least one compound semiconductor material, conductive nanoparticles (e.g., ruthenium nanoparticles), metal dots. In some embodiments, the memory material 128 comprises silicon nitride.

The tunnel dielectric material 130 may be formed of and include a dielectric material through which charge tunneling can be performed under suitable electrical bias conditions, such as through hot-carrier injection or by Fowler-Nordheim tunneling induced charge transfer. By way of non-limiting example, the tunnel dielectric material 130 may be formed of and include one or more of silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In some embodiments, the tunnel dielectric material 130 comprises silicon dioxide. In other embodiments, the tunnel dielectric material 130 comprises nitrogen, such as an oxynitride. In some such embodiments, the tunnel dielectric material 130 comprises silicon oxynitride.

In some embodiments the tunnel dielectric material 130, the memory material 128, and the charge blocking material 126 together may comprise a structure configured to trap a charge, such as, for example, an oxide-nitride-oxide (ONO) structure. In some such embodiments, the tunnel dielectric material 130 comprises silicon dioxide, the memory material 128 comprises silicon nitride, and the charge blocking material 126 comprises silicon dioxide. In other embodiments, the tunnel dielectric material 130, the memory material 128, and the charge blocking material 126 together comprise an oxide-nitride-oxynitride structure. In some such embodiments, the tunnel dielectric material 130 comprises silicon oxynitride, the memory material 128 comprises silicon nitride, and the charge blocking material 126 comprises silicon dioxide.

The channel material 132 may be formed of and include one or more of a semiconductor material (at least one elemental semiconductor material, such as polycrystalline silicon; at least one III-V compound semiconductor material, at least one II-VI compound semiconductor material, at least one organic semiconductor material, GaAs, InP, GaP, GaN, other semiconductor materials), and an oxide semiconductor material. In some embodiments, the channel material 132 includes amorphous silicon or polysilicon. In some embodiments, the channel material 132 comprises a doped semiconductor material.

The insulative material 134 may be formed of and include an electrically insulative material such as, for example, phosphosilicate glass (PSG), borosilicate glass (BSG), fluorosilicate glass (FSG), borophosphosilicate glass (BPSG), silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride), a dielectric carbon nitride material (e.g., silicon carbon nitride (SiCN)), a dielectric carboxynitride material (e.g., silicon carboxynitride (SiOCN)), or combinations thereof. In some embodiments, the insulative material 134 comprises silicon dioxide.

In some embodiments, a conductive contact may be formed vertically over and in electrical communication with the channel material 132 of the pillars 124 to electrically connect the channel material 132 of strings (e.g., strings 146 (FIG. 1G)) of memory cells (e.g., memory cells 148 (FIG. 1G)) to an access line (e.g., a data line 202 (FIG. 2)).

Figure 1H:
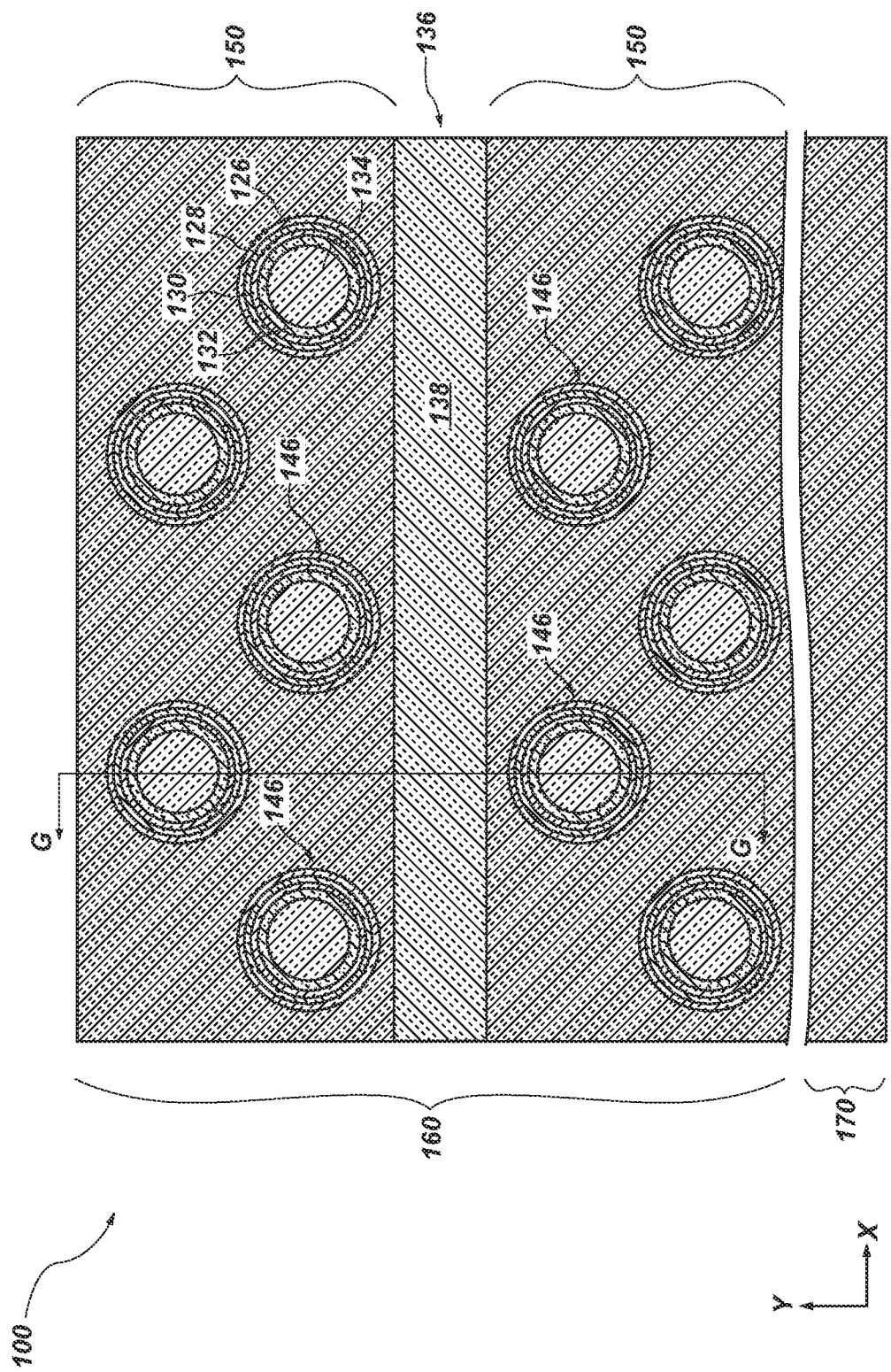

With combined reference to FIG. 1G and FIG. 1H, after forming the pillars 124 (FIG. 1F), slot structures 136 may be formed through the stack structure 102 to facilitate replacement of the additional insulative structures 106 (FIG. 1F) with conductive structures 140 through so-called "replacement gate" or "gate last" processing acts and to form block structures 150 in the microelectronic device structure 100 separated from each other by the slot structures 136. FIG. 1G is a simplified cross-sectional view of the microelectronic device structure 100 taken through section line G-G of FIG. 1H, which is a top view of the microelectronic device structure 100. The slot structures 136 may separate the microelectronic device structure 100 into block structures 150.

Slots (also referred to herein as "replacement gate slots") may be formed through the stack structure 102 at locations corresponding to the slot structures 136 to extend through the dielectric material 116, and the tiers 108 of the insulative structures 104 and the additional insulative structures 106 (FIG. 1F). In some embodiments, the slots may expose the source tier 110, such as the first source material 112.

The additional insulative structures 106 (FIG. 1F) may be selectively removed (e.g., exhumed) through the slots. Spaces between vertically neighboring (e.g., in the Z-direction) insulative structures 104 may be filled with a conductive material to form the conductive structures 140 and a stack structure 142 including tiers 144 of the insulative structures 104 and the conductive structures 140. The conductive structures 140 may be located at locations corresponding to the locations of the additional insulative structures 106 removed through the slots.

After forming the conductive structures 140, the slots may be filled with one or more materials to form the slot structures 136. In some embodiments, the slot structures 136 include an insulative material 138. The insulative material 138 may include one or more of the materials described above with reference to the insulative structures 104. In some embodiments, the insulative material 138 comprises silicon dioxide. In other embodiments, the slot structures 136 include, for example, a liner material on sidewalls thereof and a conductive material horizontally neighboring the liner material. In some such embodiments, the liner material may comprise an insulative material, such as, for example, silicon dioxide; and the conductive material may include polysilicon or tungsten and may be in electrical communication with the source tier 110 (e.g., such as through the first source material 112).

Although FIG. 1G and FIG. 1H illustrate only one slot structure 136 and only two block structures 150, the disclosure is not so limited. The microelectronic device structure 100 may include a plurality of (e.g., four, five, six, eight) block structures 150, each separated from laterally neighboring (e.g., in the Y-direction) block structures 150 by a slot structure 136. In other words, the slot structures 136 may divide the microelectronic device structure 100 into any desired number of block structures 150.

The conductive structures 140 may be formed of and include at least one conductive material, such as at least one metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), at least one alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), at least one conductively-doped semiconductor material (e.g., conductively-doped polysilicon, conductively-doped germanium (Ge), conductively-doped silicon germanium (SiGe)), at least one conductive metal-containing material (e.g., a conductive metal nitride, a conductive metal silicide, a conductive metal carbide, a conductive metal oxide), or combinations thereof. In some embodiments, the conductive structures 140 are formed of and include tungsten.

Each of the conductive structures 140 may individually include a substantially homogeneous distribution of the at least one conductive material, or a substantially heterogeneous distribution of the at least one conductive material. In some embodiments, each of the conductive structures 140 of each of the tiers 144 of the stack structure 142 exhibits a substantially homogeneous distribution of conductive material. In additional embodiments, at least one of the conductive structures 140 of at least one of the tiers 144 of the stack structure 142 exhibits a substantially heterogeneous distribution of at least one conductive material. The conductive structure 140 may, for example, be formed of and include a stack of at least two different conductive materials. The conductive structures 140 of each of the tiers 144 of the stack structure 142 may each be substantially planar, and may each exhibit a desired thickness.

In some embodiments, the conductive structures 140 may include a conductive liner material around the conductive structures 140 such as between the conductive structures 140 and the insulative structures 104. The conductive liner material may comprise, for example, a seed material from which the conductive structures 140 may be formed. The conductive liner material may be formed of and include, for example, a metal (e.g., titanium, tantalum), a metal nitride (e.g., tungsten nitride, titanium nitride, tantalum nitride), or another material. In some embodiments, the conductive liner material comprises titanium nitride.

At least one lower conductive structure 140 of the stack structure 142 may be employed as at least one lower select gate (e.g., at least one source side select gate (SGS)) of the microelectronic device structure 100. In some embodiments, a single (e.g., only one) conductive structure 140 of a vertically lowermost tier 144 of the stack structure 142 is employed as a lower select gate (e.g., a SGS) of the microelectronic device structure 100. In addition, upper conductive structure(s) 140 of the stack structure 142 may be employed as upper select gate(s) (e.g., drain side select gate(s) (SGDs)) of the microelectronic device structure 100. In some embodiments, horizontally-neighboring conductive structures 140 of a vertically uppermost tier 144 of the stack structure 142 (e.g., separated from each other by additional slot structures) are employed as upper select gates (e.g., SGDs) of the microelectronic device structure 100. In some embodiments, more than one (e.g., two, four, five, six) conductive structures 140 are employed as an upper select gate (e.g., a SGD) of the microelectronic device structure.

With continued reference to FIG. 1G, formation of the conductive structures 140 may form strings 146 of memory cells 148, each memory cell 148 located at an intersection of a conductive structure 140 and the memory cell materials (e.g., the charge blocking material 126, the memory material 128, and the tunnel dielectric material 130) and the channel material 132. Each block structure 150 may include a plurality of the strings 146 of memory cells 148. As will be described herein, each block structure 150 may include a staircase structure (e.g., staircase structure 220 (FIG. 2)) laterally offset (e.g., in the X-direction) from the strings 146 of the memory cells 148. The strings 146 of memory cells 148 may be located within horizontal boundaries of the conductive structures 140 of the tiers 144. The strings 146 may be located within the horizontal boundaries of the array region 160.

With continued reference to FIG. 1G and FIG. 1H, the peripheral region 170 may be laterally spaced (e.g., in the Y-direction) from the array region 160 including the block structures 150 including the strings 146 of memory cells 148 and the staircase structures (e.g., the staircase structure 220 (FIG. 2)). The peripheral region 170 may not include the block structures 150 including the strings 146 of memory cells 148 and the staircase structures. Thus, the microelectronic device structure 100 may include tiers 144 including the insulative structure 104 and the conductive structures 140 in the block structures 150 and including the insulative structures 104 and the additional insulative structures 106 in the peripheral region 170. The additional insulative structures 106 may laterally neighbor (e.g., in the Y-direction) the conductive structures 140 of the same tier 144.

Forming the microelectronic device structure 100 with the additional insulative structures 106 comprising the higher ratio of nitrogen atoms to silicon atoms may improve the uniformity of the pillars 124 (FIG. 1F) and the resulting strings 146 (FIG. 1G) of memory cells 148 (FIG. 1G). For example, the pillars 124 and the strings 146 may be substantially symmetrical. In some embodiments, the pillars 124 and the strings 146 may be substantially circular and the sidewalls 119 (FIG. 1G) may not exhibit a non-circular elliptical shape (e.g., an oval). Without being bound by any particular theory, it is believed that the relatively higher ratio of nitrogen atoms to silicon atoms of the additional insulative structures 106 (and the corresponding increased amount of hydrogen-nitrogen bonds relative to silicon-hydrogen bonds of the additional insulative structures 106) facilitates uniform generation of the protective material 120 (FIG. 1D) on the sidewalls 119 of the partial openings 118 (FIG. 1D). The increased ratio of nitrogen atoms relative to silicon atoms facilitates a more uniform thickness of the protective material 120 during formation of the protective material 120. For example, the additional insulative structures 106 may facilitate a higher percentage of nitrogen atoms bonded to hydrogen in the additional insulative structures 106 (e.g., additional insulative structures 106 formed from silane and ammonia precursors). The total hydrogen content of the additional insulative structures 106 may be within a range from about 10 atomic percent to about 30 atomic percent and a higher ratio of nitrogen atoms to silicon atoms in the additional insulative structures 106 may increase the atomic percent of hydrogen in the additional insulative structures 106. The increased atomic percent of hydrogen in the additional insulative structures 106 may facilitate formation and buildup of the protective material during formation of the protective material 120.

In addition, the increased ratio of the nitrogen atoms relative to silicon atoms increases the generation of hydrogen cyanide, which promotes uniform removal of the additional insulative structures 106 and a substantially circular opening. Further, the reduced amount of silicon atoms in the additional insulative structures 106 reduces the amount of non-volatile SiCN that is formed during removal of the additional insulative structures 106. Increased amounts of SiCN promotes non-uniformity of the openings 122. The substantially symmetrical and circular openings may promote substantially uniform distribution of charge (e.g., electronics) during operation of the memory cells 148 of the strings 146. By way of contrast, microelectronics device structures formed without the additional insulative structures 106 may exhibit non-circular (e.g., asymmetric, square, rectangular, triangular, oval) openings and non-circular memory strings. During operation of the memory cells, the charge (e.g., electron) density may be unevenly distributed along the non-circular shape, increasing the threshold voltage ($V_t$) required for operation of the memory cells associated with the memory strings.

Although the microelectronic device structure 100 has been described and illustrated as comprising memory cells 148 having a particular configuration, the disclosure is not so limited. In some embodiments, the memory cells 148 may comprise so-called "MONOS" (metal-oxide-nitride-oxide-semiconductor) memory cells. In additional embodiments, the memory cells 148 comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In other embodiments, the memory cells 148 comprise so-called "floating gate" memory cells including floating gates (e.g., metallic floating gates) as charge storage structures. The floating gates may horizontally intervene between central structures of the strings 146 and the conductive structures 140.

Figure 2:
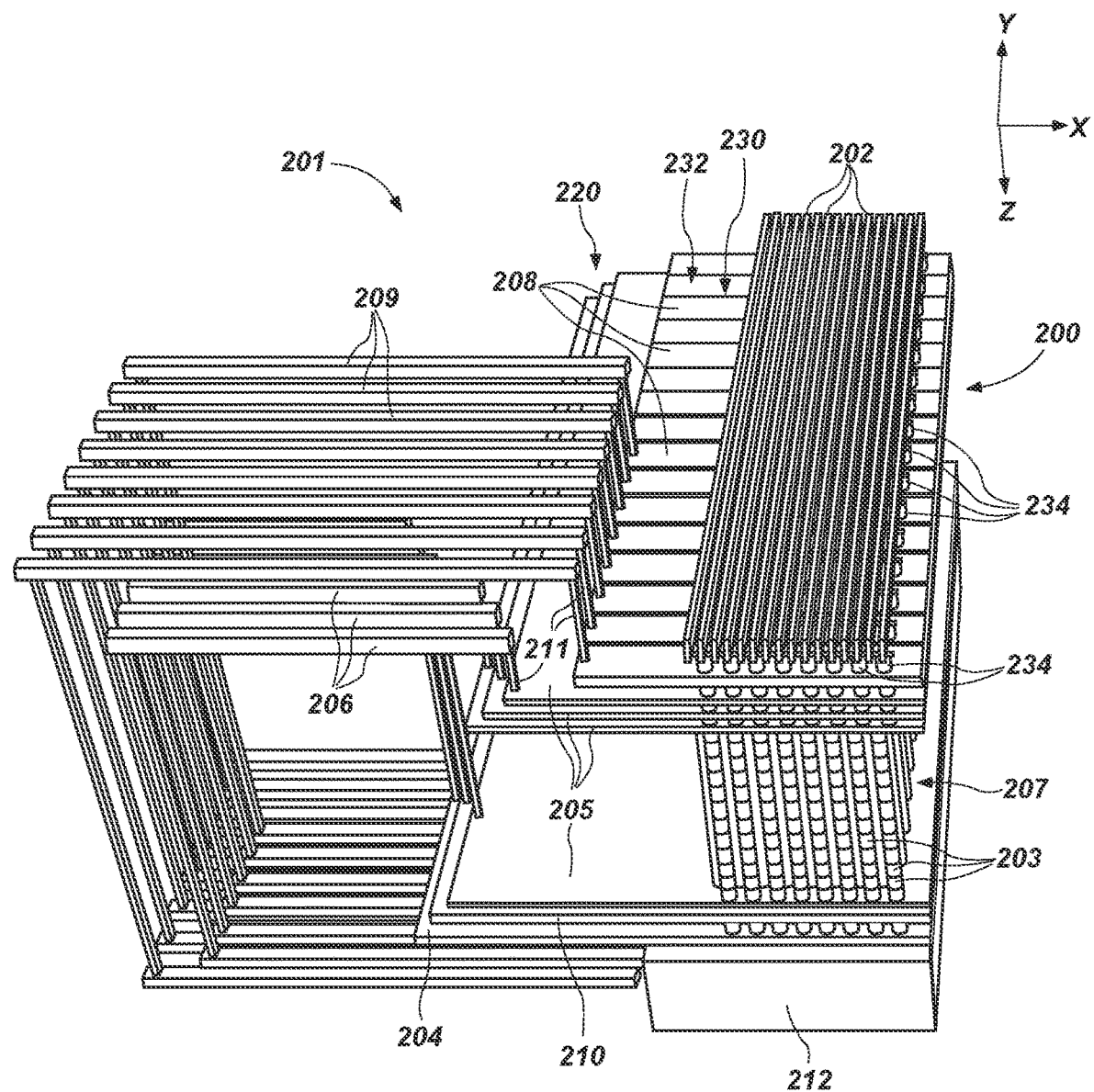
FIG. 2 is a partial cutaway perspective view of a microelectronic device, in accordance with embodiments of the disclosure.

FIG. 2 illustrates a partial cutaway perspective view of a portion of a microelectronic device 201 (e.g., a memory device, such as a dual deck 3D NAND Flash memory device) including a microelectronic device structure 200. The microelectronic device structure 200 may be substantially similar to the microelectronic device structure 100 following the processing stages previously described with reference to FIG. 1G and FIG. 1H. As shown in FIG. 2, the microelectronic device structure 200 may include a staircase structure 220 defining contact regions for connecting access lines 206 to conductive tiers 205 (e.g., conductive layers, conductive plates, such as the conductive structures 140 (FIG. 1G)). The microelectronic device structure 200 may include vertical strings 207 (e.g., strings 146 (FIG. 1G, FIG. 1H)) of memory cells 203 (e.g., memory cells 148 (FIG. 1G)) that are coupled to each other in series. The vertical strings 207 may extend vertically (e.g., in the Z-direction) and orthogonally to conductive lines and conductive tiers 205, such as data lines 202 (e.g., bit lines), a source tier 204 (e.g., the source tier 110 (FIG. 1G)), the conductive tiers 205, the access lines 206, first select gates 208 (e.g., upper select gates, drain select gates (SGDs), such as upper ones of the conductive structures 140 (FIG. 1G)), select lines 209, and a second select gate 210 (e.g., a lower select gate, a source select gate (SGS), such as lower ones of the conductive structures 140). The first select gates 208 may be horizontally divided (e.g., in the Y-direction) into multiple block structures 232 (e.g., blocks 150 (FIG. 1G, FIG. 1H)) and sub-blocks horizontally separated (e.g., in the Y-direction) from one another by slot structures 230 (e.g., slot structures 136 (FIG. 1G, FIG. 1H)).

The data lines 202 may be electrically coupled to the vertical strings 207 through conductive contact structures 234.

Vertical conductive contacts 211 may electrically couple components to each other as shown. For example, the select lines 209 may be electrically coupled to the first select gates 208 and the access lines 206 may be electrically coupled to the conductive tiers 205. The microelectronic device 201 may also include a control unit 212 positioned under the memory array, which may include control logic devices configured to control various operations of other features (e.g., the vertical strings 207 of memory cells 203) of the microelectronic device 201. By way of non-limiting example, the control unit 212 may include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), $V_{dd}$ regulators, drivers (e.g., string drivers), decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, MUX, error checking and correction (ECC) devices, self-refresh/wear leveling devices, and other chip/deck control circuitry. The control unit 212 may be electrically coupled to the data lines 202, the source tier 204, the access lines 206, the first select gates 208, and the second select gates 210, for example. In some embodiments, the control unit 212 includes CMOS (complementary metal-oxide-semiconductor) circuitry. In such embodiments, the control unit 212 may be characterized as having a "CMOS under Array" ("CuA") configuration.

The first select gates 208 may extend horizontally in a first direction (e.g., the X-direction) and may be coupled to respective first groups of vertical strings 207 of memory cells 203 at a first end (e.g., an upper end) of the vertical strings 207. The second select gate 210 may be formed in a substantially planar configuration and may be coupled to the vertical strings 207 at a second, opposite end (e.g., a lower end) of the vertical strings 207 of memory cells 203.

The data lines 202 (e.g., bit lines) may extend horizontally in a second direction (e.g., in the Y-direction) that is at an angle (e.g., perpendicular) to the first direction in which the first select gates 208 extend. The data lines 202 may be coupled to respective second groups of the vertical strings 207 at the first end (e.g., the upper end) of the vertical strings 207. A first group of vertical strings 207 coupled to a respective first select gate 208 may share a particular vertical string 207 with a second group of vertical strings 207 coupled to a respective data line 202. Thus, a particular vertical string 207 may be selected at an intersection of a particular first select gate 208 and a particular data line 202. Accordingly, the first select gates 208 may be used for selecting memory cells 203 of the vertical strings 207 of memory cells 203.

The conductive tiers 205 may extend in respective horizontal planes. The conductive tiers 205 may be stacked vertically, such that each conductive tier 205 is coupled to all of the vertical strings 207 of memory cells 203, and the vertical strings 207 of the memory cells 203 extend vertically through the stack of conductive tiers 205. The conductive tiers 205 may be coupled to or may form control gates of the memory cells 203 to which the conductive tiers 205 are coupled. Each conductive tier 205 may be coupled to one memory cell 203 of a particular vertical string 207 of memory cells 203.

The first select gates 208 and the second select gates 210 may operate to select a particular vertical string 207 of the memory cells 203 between a particular data line 202 and the source tier 204. Thus, a particular memory cell 203 may be selected and electrically coupled to a data line 202 by operation of (e.g., by selecting) the appropriate first select gate 208, second select gate 210, and conductive tier 205 that are coupled to the particular memory cell 203.

The staircase structure 220 may be configured to provide electrical connection between the access lines 206 and the conductive tiers 205 through the vertical conductive contacts 211. In other words, a particular level of the conductive tiers 205 may be selected via an access line 206 in electrical communication with a respective vertical conductive contact 211 in electrical communication with the particular conductive tier 205.

As described above, with reference to the microelectronic device structure 100, the composition of the additional insulative structures 106 (FIG. 1A, FIG. 1G) may facilitate substantially vertical (e.g., in the Z-direction) and substantially circular (e.g., in the XY plane) vertical strings 207 of memory cells 203. The vertical strings 207 of memory cells 203 may exhibit improved performance during use and operation thereof.

Thus, in accordance with some embodiments of the disclosure, a method of forming a microelectronic device comprises forming a stack structure comprising a vertically alternating sequence of insulative structures and additional insulative structures, at least some of the additional insulative structures comprising silicon nitride having a ratio of nitrogen atoms to silicon atoms greater than about 1.58:1.00, forming openings through the stack structure, and forming cell pillar structures within the openings, the cell pillar structures individually comprising a semiconductor channel material vertically extending through the stack structure.

Furthermore, in accordance with additional embodiments of the disclosure, a method of forming a microelectronic device comprises forming a stack structure comprising vertically alternating insulative structures and additional insulative structures arranged in tiers, the additional insulative structures horizontally extending through an array region of the stack structure to a peripheral region of the stack structure and individually having a ratio of nitrogen atoms to silicon atoms greater than about 1.58:1.00, forming strings of memory cell vertically extending through the stack structure and within horizontal boundaries of the array region of the stack structure, forming slots vertically extending through the stack structure and within the horizontal boundaries of the array region of the stack structure, and replacing portions of the additional insulative structures within the array region of the stack structure with conductive structures while maintaining additional portions of the additional insulative structures within the peripheral region of the stack structure.

Moreover, in accordance with further embodiments of the disclosure, a microelectronic device a stack structure comprising first levels comprising insulative structures, and second levels vertically interleaved with the first levels and each comprising an additional insulative structure and a conductive structure horizontally neighboring the additional insulative structure, the additional insulative structure of at least some of the second levels comprising silicon nitride having a ratio of nitrogen atoms to silicon atoms greater than about 1.58:1.00. The microelectronic device further comprises strings of memory cells vertically extending through the stack structure and each within horizontal boundaries of the conductive structures of each of the second levels.

In accordance with additional embodiments, a memory device comprises a stack structure comprising an array region comprising a vertically alternating sequence of insulative structures and conductive structures, a peripheral region comprising a vertically alternating sequence of the insulative structures and additional insulative structures arranged in additional tiers horizontally neighboring the tiers of the array region, at least some of the additional insulative structures comprising silicon nitride comprising greater than or equal to about 1.60 silicon atoms for every about 1.00 nitrogen atom, and strings of memory cells in the array region of the stack structure and comprising a channel material vertically extending through the stack structure.

Figure 3:
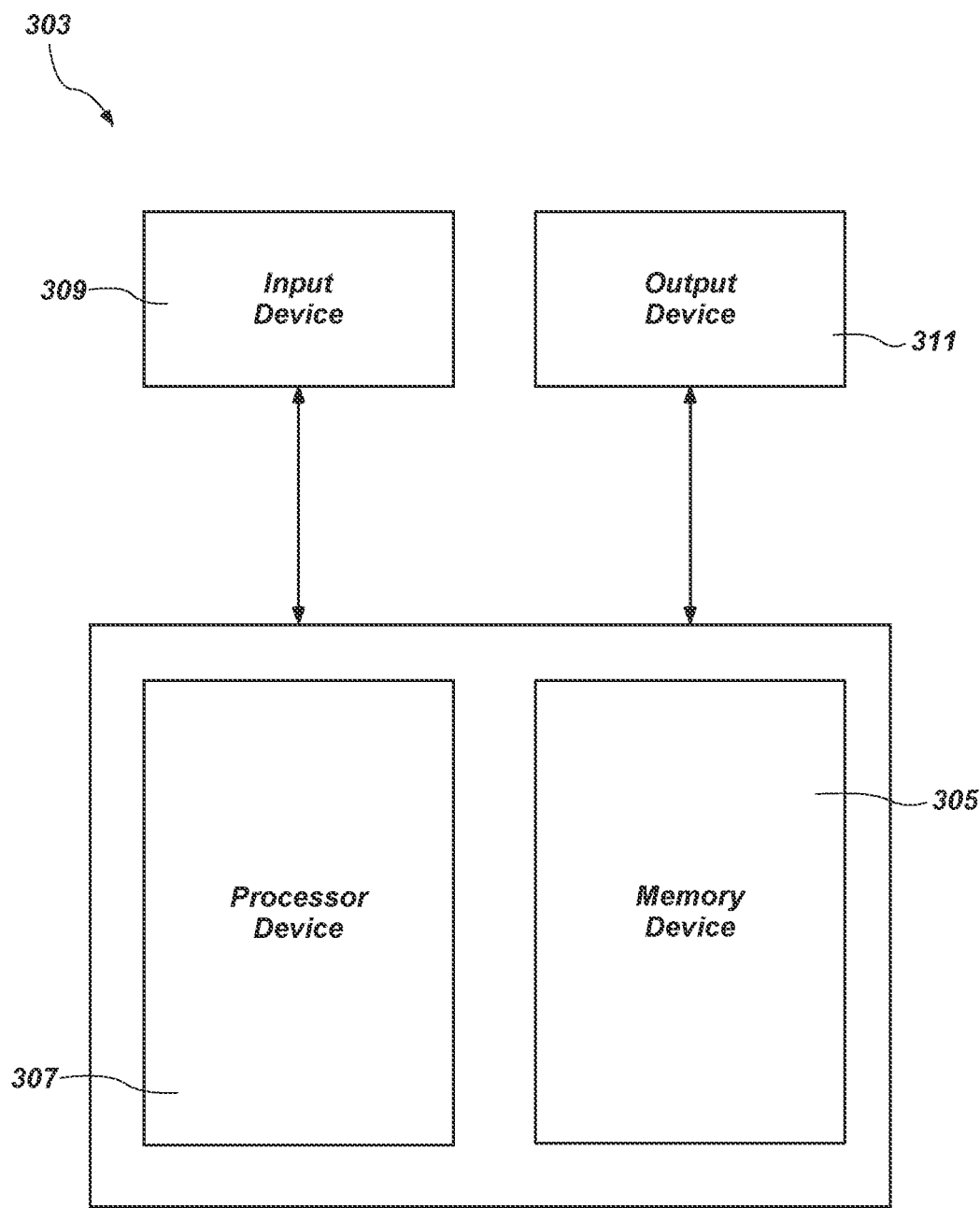
FIG. 3 is a block diagram of an electronic system, in accordance with embodiments of the disclosure.

Microelectronic devices (e.g., the microelectronic device 201 (FIG. 2)) and microelectronic device structures (e.g., the microelectronic device structures 100, 200) of the disclosure may be included in embodiments of electronic systems of the disclosure. For example, FIG. 3 is a block diagram of an electronic system 303, in accordance with embodiments of the disclosure. The electronic system 303 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an IPAD® or SURFACE® tablet, an electronic book, a navigation device, etc. The electronic system 303 includes at least one memory device 305. The memory device 305 may include, for example, an embodiment one or more of a microelectronic device structure herein (e.g., the microelectronic device structure 100, 200) and a microelectronic device (e.g., the microelectronic device 201) previously described herein.

The electronic system 303 may further include at least one electronic signal processor device 307 (often referred to as a "microprocessor"). The electronic signal processor device 307 may, optionally, include an embodiment of one or more of a microelectronic device and a microelectronic device structure previously described herein. The electronic system 303 may further include one or more input devices 309 for inputting information into the electronic system 303 by a user, such as, for example, a mouse or other pointing device, a keyboard, a touchpad, a button, or a control panel. The electronic system 303 may further include one or more output devices 311 for outputting information (e.g., visual or audio output) to a user such as, for example, a monitor, a display, a printer, an audio output jack, a speaker, etc. In some embodiments, the input device 309 and the output device 311 may comprise a single touchscreen device that can be used both to input information to the electronic system 303 and to output visual information to a user. The input device 309 and the output device 311 may communicate electrically with one or more of the memory device 305 and the electronic signal processor device 307.

Figure 4:
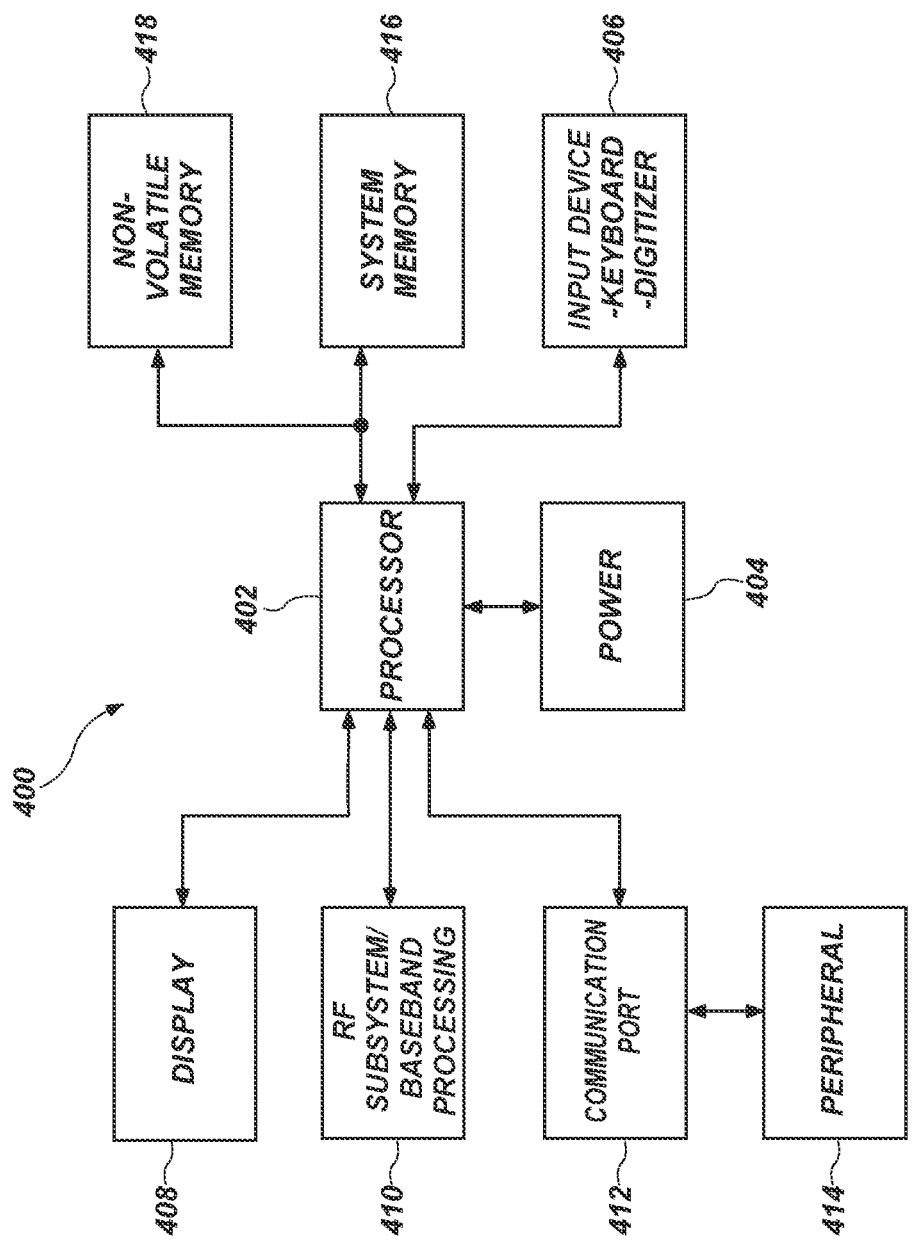
FIG. 4 is a block diagram of a processor-based system, in accordance with embodiments of the disclosure.

With reference to FIG. 4, depicted is a processor-based system 400. The processor-based system 400 may include one or more of a microelectronic device and a microelectronic device structure previously described herein and manufactured in accordance with embodiments of the disclosure. The processor-based system 400 may be any of a variety of types such as a computer, pager, cellular phone, personal organizer, control circuit, or other electronic device. The processor-based system 400 may include one or more processors 402, such as a microprocessor, to control the processing of system functions and requests in the processor-based system 400. The processor 402 and other subcomponents of the processor-based system 400 may include one or more of a microelectronic device and a microelectronic device structure previously described herein and manufactured in accordance with embodiments of the present disclosure.

The processor-based system 400 may include a power supply 404 in operable communication with the processor 402. For example, if the processor-based system 400 is a portable system, the power supply 404 may include one or more of a fuel cell, a power scavenging device, permanent batteries, replaceable batteries, and rechargeable batteries. The power supply 404 may also include an AC adapter; therefore, the processor-based system 400 may be plugged into a wall outlet, for example. The power supply 404 may also include a DC adapter such that the processor-based system 400 may be plugged into a vehicle cigarette lighter or a vehicle power port, for example.

Various other devices may be coupled to the processor 402 depending on the functions that the processor-based system 400 performs. For example, a user interface 406 may be coupled to the processor 402. The user interface 406 may include input devices such as buttons, switches, a keyboard, a light pen, a mouse, a digitizer and stylus, a touch screen, a voice recognition system, a microphone, or a combination thereof. A display 408 may also be coupled to the processor 402. The display 408 may include an LCD display, an SED display, a CRT display, a DLP display, a plasma display, an OLED display, an LED display, a three-dimensional projection, an audio display, or a combination thereof. Furthermore, an RF sub-system/baseband processor 410 may also be coupled to the processor 402. The RF sub-system/baseband processor 410 may include an antenna that is coupled to an RF receiver and to an RF transmitter (not shown). A communication port 412, or more than one communication port 412, may also be coupled to the processor 402. The communication port 412 may be adapted to be coupled to one or more peripheral devices 414, such as a modem, a printer, a computer, a scanner, or a camera, or to a network, such as a local area network, remote area network, intranet, or the Internet, for example.

The processor 402 may control the processor-based system 400 by implementing software programs stored in the memory. The software programs may include an operating system, database software, drafting software, word processing software, media editing software, or media playing software, for example. The memory is operably coupled to the processor 402 to store and facilitate execution of various programs. For example, the processor 402 may be coupled to system memory 416, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 416 may include volatile memory, non-volatile memory, or a combination thereof. The system memory 416 is typically large so that it can store dynamically loaded applications and data. In some embodiments, the system memory 416 may include semiconductor devices, such as one or more of a microelectronic devices and a microelectronic device structure previously described herein.

The processor 402 may also be coupled to non-volatile memory 418, which is not to suggest that system memory 416 is necessarily volatile. The non-volatile memory 418 may include one or more of STT-MRAM, MRAM, read-only memory (ROM) such as an EPROM, resistive read-only memory (RROM), and flash memory to be used in conjunction with the system memory 416. The size of the non-volatile memory 418 is typically selected to be just large enough to store any necessary operating system, application programs, and fixed data. Additionally, the non-volatile memory 418 may include a high-capacity memory such as disk drive memory, such as a hybrid-drive including resistive memory or other types of non-volatile solid-state memory, for example. The non-volatile memory 418 may include microelectronic devices, such as one or more of a microelectronic device and a microelectronic device structure previously described herein.

Accordingly, in at least some embodiments, an electronic device comprises an input device, an output device, a processor device operably coupled to the input device and the output device, and a memory device operably coupled to the processor device and comprising at least one microelectronic device structure. The at least one microelectronic device structure comprises an array region comprising strings of memory cells vertically extending through a vertically alternating sequence of insulative structures and conductive structures, and a peripheral region comprising a vertically alternating sequence of the insulative structures and additional insulative structures, the additional insulative structures of the peripheral region vertically aligned with the conductive structures of the array region, and at least some of the additional insulative structures comprising a ratio of silicon atoms to nitrogen atoms greater than about 1.58:1.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic device, comprising:
   a stack structure including an array region and a peripheral region horizontally neighboring the array region, the stack structure comprising:
      a first region comprising first levels respectively comprising:
         silicon oxide material within the array region and the peripheral region;
         within the array region, conductive material vertically adjacent the silicon oxide material; and
         within the peripheral region, silicon nitride material vertically adjacent the silicon oxide material and having a first refractive index and a first ratio of nitrogen atoms to silicon atoms greater than about 1.60:1.00; and
      a second region vertically overlying the first region and including second levels respectively comprising:
         the silicon oxide material within the array region and the peripheral region;
         within the array region, the conductive material vertically adjacent the silicon oxide material; and
         within the peripheral region, additional silicon nitride material vertically adjacent the silicon oxide material, the additional silicon nitride material having a second refractive index greater than the first refractive index and having a second ratio of nitrogen atoms to silicon atoms less than about 1.60:1.00; and
      a third region vertically overlying the second region and including third levels respectively comprising:
         the silicon oxide material within the array region and the peripheral region;
         within the array region, the conductive material vertically adjacent the silicon oxide material; and
         within the peripheral region, the silicon nitride material vertically adjacent the silicon oxide material; and
   strings of memory cells vertically extending through the stack structure and horizontally confined within the array region of the stack structure.

2. The microelectronic device of claim 1, wherein the second ratio of the nitrogen atoms to silicon atoms increases with an increasing vertical distance from a center of the stack structure.

3. The microelectronic device of claim 1, wherein, within the array region, the stack structure is divided into block structures separated from one another and portions of the stack structure within the peripheral region by insulative slot structures, the block structures having the strings of memory cells within horizontal areas thereof.

4. The microelectronic device of claim 3, further comprising, within the horizontal areas of the block structures, staircase structures laterally neighboring the strings of memory cells.

* * * * *